United States Patent
DeLaCruz et al.

(10) Patent No.: US 11,205,625 B2
(45) Date of Patent: *Dec. 21, 2021

(54) WAFER-LEVEL BONDING OF OBSTRUCTIVE ELEMENTS

(71) Applicant: INVENSAS BONDING TECHNOLOGIES, INC., San Jose, CA (US)

(72) Inventors: Javier A. DeLaCruz, San Jose, CA (US); Rajesh Katkar, San Jose, CA (US)

(73) Assignee: Invensas Bonding Technologies, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/846,177

(22) Filed: Apr. 10, 2020

(65) Prior Publication Data

US 2020/0328165 A1    Oct. 15, 2020

Related U.S. Application Data

(60) Provisional application No. 62/953,106, filed on Dec. 23, 2019, provisional application No. 62/875,370, (Continued)

(51) Int. Cl.
   *H01L 23/00*        (2006.01)

(52) U.S. Cl.
   CPC ............ *H01L 23/573* (2013.01); *H01L 24/05* (2013.01); *H01L 24/48* (2013.01); *H01L 24/83* (2013.01);
   (Continued)

(58) Field of Classification Search
   CPC combination set(s) only.
   See application file for complete search history.

(56) References Cited

U.S. PATENT DOCUMENTS 5,451,547 A    9/1995 Himi et al.
5,753,536 A    5/1998 Sugiyama et al.
(Continued)

FOREIGN PATENT DOCUMENTS

JP    2002-353416       12/2002
JP    2010-272622 A     12/2010
(Continued)

OTHER PUBLICATIONS

International Search Report and Written Opinion dated Jul. 29, 2020, in International Application No. PCT/US2020/027772, 8 pages.

(Continued)

*Primary Examiner* — Mamadou L Diallo
(74) *Attorney, Agent, or Firm* — Knobbe Martens Olson & Bear LLP

(57) ABSTRACT

A bonded structure is disclosed. The bonded structure can include a semiconductor element comprising active circuitry. The bonded structure can include an obstructive element bonded to the semiconductor element along a bond interface, the obstructive element including an obstructive material disposed over the active circuitry, the obstructive material configured to obstruct external access to the active circuitry. The bonded element can include an artifact structure indicative of a wafer-level bond in which the semiconductor element and the obstructive element formed part of respective wafers directly bonded prior to singulation.

28 Claims, 15 Drawing Sheets

Related U.S. Application Data filed on Jul. 17, 2019, provisional application No. 62/953,058, filed on Dec. 23, 2019, provisional application No. 62/833,491, filed on Apr. 12, 2019.

(52) U.S. Cl.
CPC .... *H01L 24/94* (2013.01); *H01L 2224/04042* (2013.01); *H01L 2224/83896* (2013.01)

(56) References Cited

U.S. PATENT DOCUMENTS

| | | | |
|---|---|---|---|
| 5,771,555 A | 6/1998 | Eda et al. | |
| 6,080,640 A | 6/2000 | Gardner et al. | |
| 6,180,496 B1 | 1/2001 | Farrens et al. | |
| 6,423,640 B1 | 7/2002 | Lee et al. | |
| 6,465,892 B1 | 10/2002 | Suga | |
| 6,645,828 B1 | 11/2003 | Farrens et al. | |
| 6,887,769 B2 | 5/2005 | Kellar et al. | |
| 6,908,027 B2 | 6/2005 | Tolchinsky et al. | |
| 6,908,832 B2 | 6/2005 | Farrens et al. | |
| 7,045,453 B2 | 5/2006 | Canaperi et al. | |
| 7,105,980 B2 | 9/2006 | Abbott et al. | |
| 7,193,423 B1 | 3/2007 | Dalton et al. | |
| 7,489,013 B1 | 2/2009 | Chubin et al. | |
| 7,750,488 B2 | 7/2010 | Patti et al. | |
| 7,803,693 B2 | 9/2010 | Trezza | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,809,123 B2 | 8/2014 | Liu et al. | |
| 8,841,002 B2 | 9/2014 | Tong | |
| 9,093,350 B2 | 7/2015 | Endo et al. | |
| 9,142,517 B2 | 9/2015 | Liu et al. | |
| 9,171,756 B2 | 10/2015 | Enquist et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,246,311 B1* | 1/2016 | Raring | H01S 5/32308 |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,385,024 B2 | 7/2016 | Tong et al. | |
| 9,394,161 B2 | 7/2016 | Cheng et al. | |
| 9,431,368 B2 | 8/2016 | Enquist et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,799,587 B2 | 10/2017 | Fujii et al. | |
| 9,852,988 B2 | 12/2017 | Enquist et al. | |
| 9,893,004 B2 | 2/2018 | Yazdani | |
| 9,899,442 B2 | 2/2018 | Katkar | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,002,844 B1 | 6/2018 | Wang et al. | |
| 10,026,605 B2 | 7/2018 | Doub et al. | |
| 10,075,657 B2 | 9/2018 | Fahim et al. | |
| 10,204,893 B2 | 2/2019 | Uzoh et al. | |
| 10,269,708 B2 | 4/2019 | Enquist et al. | |
| 10,269,756 B2 | 4/2019 | Uzoh | |
| 10,276,619 B2 | 4/2019 | Kao et al. | |
| 10,276,909 B2 | 4/2019 | Huang et al. | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,522,499 B2 | 12/2019 | Enquist et al. | |
| 10,727,219 B2 | 7/2020 | Uzoh et al. | |
| 10,840,205 B2 | 11/2020 | Fountain, Jr. et al. | |
| 10,923,408 B2 | 2/2021 | Huang et al. | |
| 2002/0003307 A1 | 1/2002 | Suga | |
| 2004/0084414 A1 | 5/2004 | Sakai et al. | |
| 2004/0188819 A1* | 9/2004 | Farnworth | H01L 25/50 |
| | | | 257/686 |
| 2006/0057945 A1 | 3/2006 | Hsu et al. | |
| 2007/0111386 A1 | 5/2007 | Kim et al. | |
| 2008/0088996 A1 | 4/2008 | Bonvalot et al. | |
| 2008/0251906 A1 | 10/2008 | Eaton et al. | |
| 2009/0246355 A9 | 10/2009 | Lower et al. | |
| 2010/0032776 A1 | 2/2010 | Pham et al. | |
| 2010/0171202 A1 | 7/2010 | Tian et al. | |
| 2011/0090658 A1 | 4/2011 | Adams et al. | |
| 2012/0256305 A1 | 10/2012 | Kaufmann et al. | |
| 2014/0035136 A1 | 2/2014 | Buer et al. | |
| 2014/0175655 A1 | 6/2014 | Chen et al. | |
| 2015/0064498 A1 | 3/2015 | Tong | |
| 2015/0262976 A1 | 9/2015 | Edelstein et al. | |
| 2016/0315055 A1 | 10/2016 | Vogt et al. | |
| 2016/0343682 A1 | 11/2016 | Kawasaki | |
| 2017/0373024 A1 | 12/2017 | Graf et al. | |
| 2018/0061781 A1 | 3/2018 | Petitdidier et al. | |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0190580 A1 | 7/2018 | Haba et al. | |
| 2018/0190583 A1 | 7/2018 | DeLaCruz et al. | |
| 2018/0219038 A1 | 8/2018 | Gambino et al. | |
| 2018/0226375 A1 | 8/2018 | Enquist et al. | |
| 2018/0273377 A1 | 9/2018 | Katkar et al. | |
| 2018/0286805 A1 | 10/2018 | Huang et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0096741 A1 | 3/2019 | Uzoh et al. | |
| 2019/0096842 A1 | 3/2019 | Fountain, Jr. et al. | |
| 2019/0115277 A1 | 4/2019 | Yu et al. | |
| 2019/0131277 A1 | 5/2019 | Yang et al. | |
| 2019/0198407 A1 | 6/2019 | Huang et al. | |
| 2019/0198409 A1 | 6/2019 | Katkar et al. | |
| 2019/0265411 A1 | 8/2019 | Huang et al. | |
| 2019/0333550 A1 | 10/2019 | Fisch | |
| 2019/0348336 A1 | 11/2019 | Katkar et al. | |
| 2019/0385966 A1 | 12/2019 | Gao et al. | |
| 2020/0013637 A1 | 1/2020 | Haba | |
| 2020/0013765 A1 | 1/2020 | Fountain, Jr. et al. | |
| 2020/0075534 A1 | 3/2020 | Gao et al. | |
| 2020/0118973 A1 | 4/2020 | Wang et al. | |
| 2020/0126906 A1 | 4/2020 | Uzoh et al. | |
| 2020/0194396 A1 | 6/2020 | Uzoh | |
| 2020/0227367 A1 | 7/2020 | Haba et al. | |
| 2020/0249324 A1* | 8/2020 | Steinberg | G01S 7/4814 |
| 2020/0294908 A1 | 9/2020 | Haba et al. | |
| 2020/0328162 A1* | 10/2020 | Haba | H01L 24/83 |
| 2020/0328164 A1* | 10/2020 | DeLaCruz | H01L 24/32 |
| 2020/0371154 A1* | 11/2020 | DeLaCruz | H01L 24/10 |
| 2020/0395321 A1 | 12/2020 | Katkar et al. | |
| 2021/0098412 A1 | 4/2021 | Haba et al. | |
| 2021/0181510 A1 | 6/2021 | Katkar et al. | |

(56) References Cited

U.S. PATENT DOCUMENTS

2021/0193603 A1 6/2021 Katkar et al.
2021/0193625 A1 6/2021 DeLaCruz et al.

FOREIGN PATENT DOCUMENTS

| | | |
|---|---|---|
| JP | 2013-033786 A | 2/2013 |
| JP | 2018-160519 | 10/2018 |
| WO | WO 2005/043584 A2 | 5/2005 |

OTHER PUBLICATIONS

Amirfeiz et al., "Formation of silicon structures by plasma-activated wafer bonding," Journal of The Electrochemical Society, 2000, vol. 147, No. 7, pp. 2693-2698.

Bengtsson et al., "Low temperature bonding," International Conference on Compliant & Alternative Substrate Technology, Sep. 1999, p. 10.

Farrens et al., "Chemical free room temperature wafer to wafer direct bonding," J. Electrochem. Soc., The Electrochemical Society, Inc., Nov. 1995, vol. 142, No. 11. pp. 3949-3955.

Gan, Qing, "Surface activation enhanced low temperature silicon wafer bonding," Dissertation submitted in partial fulfillment of the requirements for the degree of Doctor of Philosophy, Department of Mechanical Engineering and Materials Science, Duke University, Aug. 4, 2000, 192 pages.

Gösele et al., "Semiconductor Wafer Bonding: A flexible approach to materials combinations in microelectronics; micromechanics and optoelectronics," IEEE, 1997, pp. 23-32.

Reiche et al., "The effect of a plasma pretreatment on the Si/Si bonding behaviouir," Electrochemical Society Proceedings, 1998, vol. 97-36, pp. 437-444.

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Daneman, "Applying the CMOS Test Flow to MEMS Manufacturing", InvenSense, Inc., accessed on Apr. 5, 2020.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences-Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1(I), 6 pages.

Plobi, A. et al., "Wafer direct bonding: tailoring adhesion between brittle materials," Materials Science and Engineering Review Journal, 1999, R25, 88 pages.

\* cited by examiner

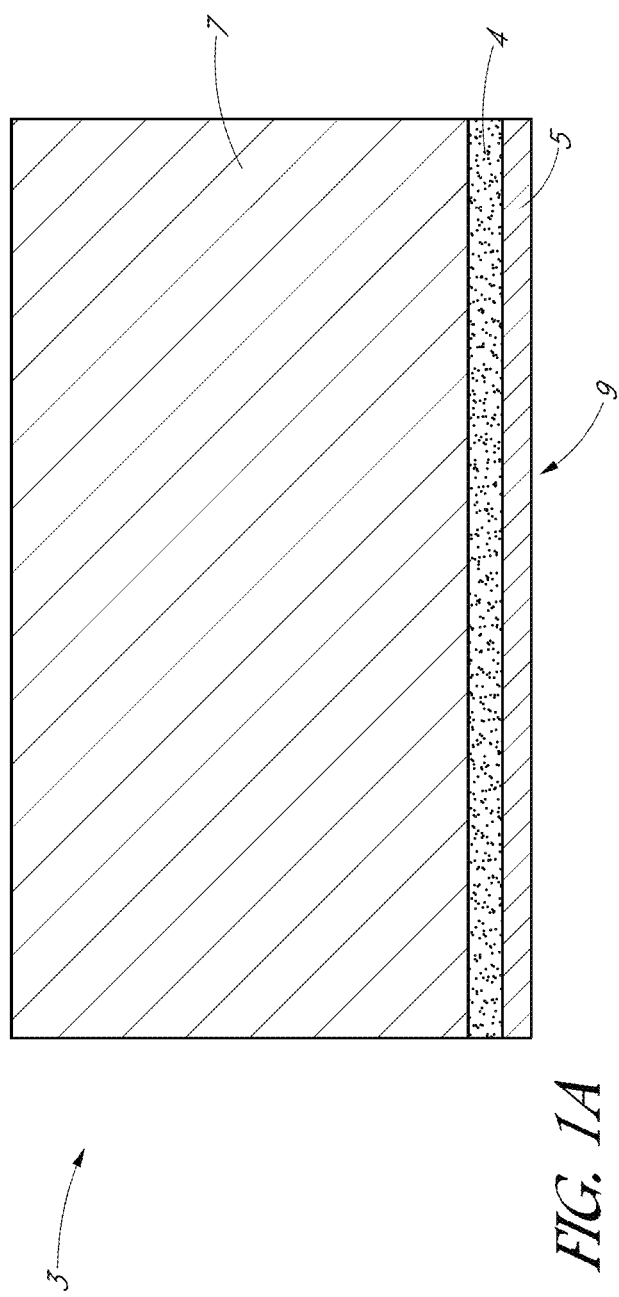
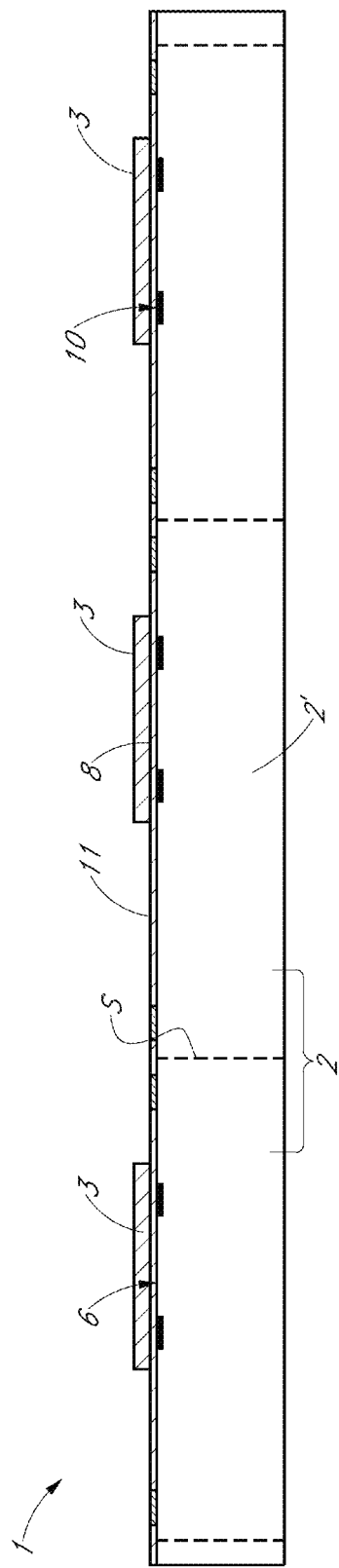
FIG. 1A
FIG. 1B

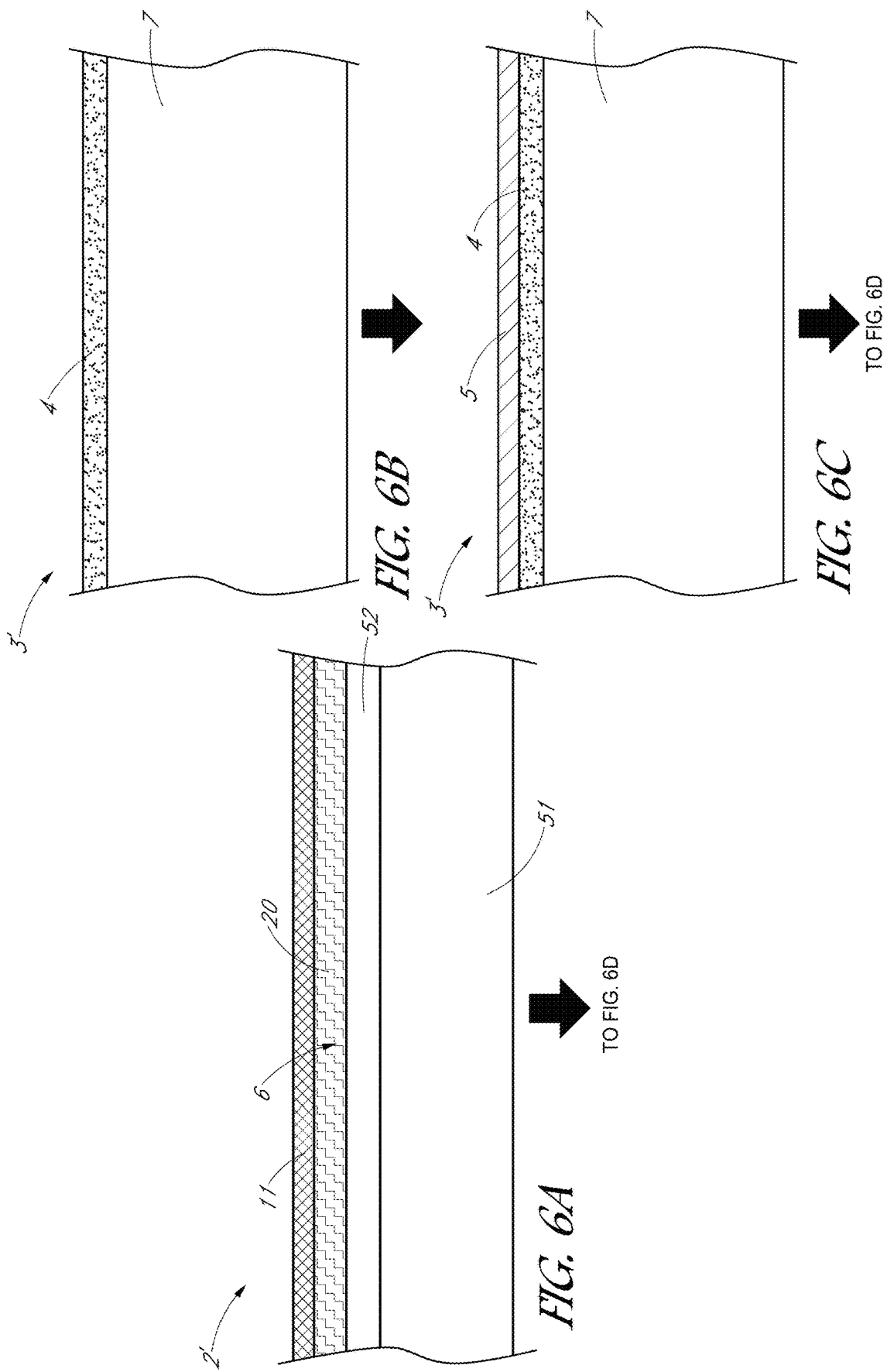

WAFER-LEVEL BONDING OF OBSTRUCTIVE ELEMENTS

CROSS-REFERENCE TO RELATED APPLICATIONS

This application claims priority to U.S. Provisional Patent Application No. 62/875,370, filed Jul. 17, 2019; claims priority to U.S. Provisional Patent Application No. 62/953,106, filed Dec. 23, 2019; claims priority to U.S. Provisional Patent Application No. 62/833,491, filed Apr. 12, 2019; and claims priority to U.S. Provisional Patent Application No. 62/953,058, filed Dec. 23, 2019, the contents of each of which are hereby incorporated by reference herein in their entirety and for all purposes.

BACKGROUND

Field

The field relates to wafer-level bonding of obstructive elements to semiconductor elements.

Description of the Related Art

Semiconductor chips (e.g., integrated device dies) may include active circuitry containing security-sensitive components which contain valuable and/or proprietary information, structures or devices. For example, such security-sensitive components may include an entity's intellectual property, software or hardware security (e.g., encryption) features, privacy data, or any other components or data that the entity may wish to remain secure and hidden from third parties. For example, third party bad actors may utilize various techniques to attempt to access security-sensitive components for economic and/or geopolitical advantage. Accordingly, there remains a continuing need for improving the security of semiconductor chips from being accessed by third parties.

BRIEF DESCRIPTION OF THE DRAWINGS

FIG. 1A is a schematic side sectional view of an obstructive element.

FIG. 1B is a schematic side sectional view of a bonded structure that includes a plurality of obstructive elements directly bonded to a semiconductor element.

FIGS. 6A-6E are schematic side sectional views illustrating a process flow for forming a bonded structure using a W2W silicon-on-insulator (SOI) processing technique, according to another embodiment.

DETAILED DESCRIPTION

Figure 2A:
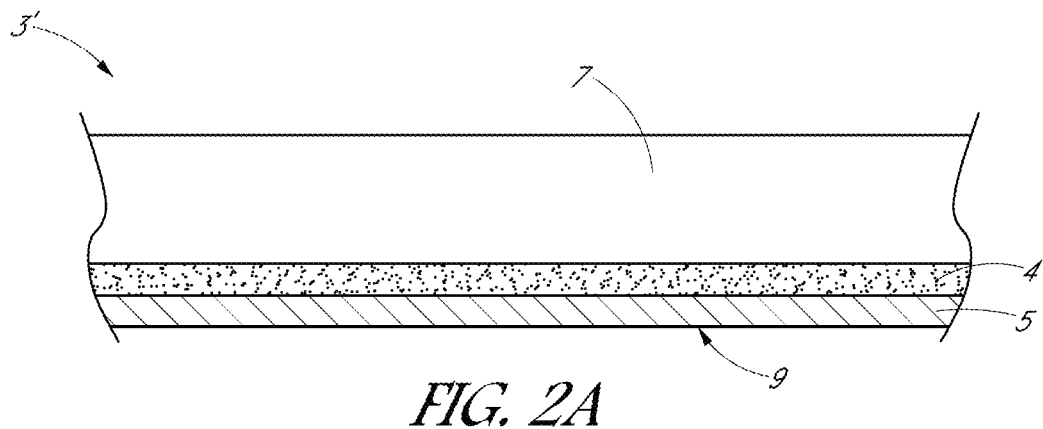
FIGS. 2A-2E are schematic side sectional views illustrating various steps in forming a bonded structure using wafer-to-wafer (W2W) processing techniques, according to various embodiments.

As explained herein, third parties (such as third party bad actors) may attempt to access security-sensitive components on elements such as integrated device dies. In some elements, the security-sensitive components may be protected by a combination of netlist and non-volatile memory (NVM) data. However, third parties may attempt to hack the security-sensitive components by a combination of destructive and non-destructive techniques, e.g. probing and/or delayering the element to expose or otherwise gain access to the security-sensitive components. In some cases, the third party may attempt to hack the security-sensitive components by pulsing electromagnetic (EM) waves onto active circuitry of the element, using fault injection techniques, employing near infrared (NIR) triggering or focused ion beam (FIB) modification of circuits, chemical etching techniques, and other physical, chemical, and/or electromagnetic hacking tools and even reverse engineering. These techniques can be used to physically access sensitive circuits of microdevices such as integrated circuits to directly read encrypted information, to trigger circuits externally to release information otherwise encrypted, to understand manufacturing processes, or even to extract enough information to be able to eventually replicate sensitive designs. For example, in some cases hackers may attempt to access the encryption key, which can be stored in the circuit design, in memory, or in a combination of both. Techniques can also be used to indirectly read sensitive information by analyzing the resultant output based upon fault injection inputs, and through recursive analysis determine the encryption key or data contents. It is challenging to structurally protect the security-sensitive components on elements.

Accordingly, it is important to provide improved security for elements (such as semiconductor integrated device dies) that include security-sensitive components.

One way to physically protect chips from such unauthorized access is to provide materials that are difficult to remove or penetrate by grinding, polishing, chemical etching or by any other technique. However, processing (e.g., depositing) some such materials (e.g., abrasive materials) may entail a process temperature that is too high to subject a processed integrated circuit to without exceeding its thermal budget, and or involve processing that is incompatible with typical semiconductor processing foundries. The obstructive materials may not be typically used or found in standard semiconductor processing foundries, and/or the obstructive materials may utilize non-standard processing.

Various embodiments disclosed herein can utilize a chip or chiplet having an obstructive element 3 including, for example, a security or obstructive material 4 that protects a sensitive circuit region 6 (also referred to herein as sensitive circuitry) to which it is bonded.

In some embodiments, the obstructive material 4 can include a physically destructive material (e.g., an abrasive and/or hard material) configured to physically damage or destroy tooling that attempts to access sensitive circuitry 6, to physically damage or destroy the sensitive circuitry 6 itself, or otherwise prevent physical or mechanical access to the sensitive circuitry 6. In some embodiments, the obstructive material 4 can additionally or alternatively comprise a light-blocking material configured to block incident electromagnetic radiation (e.g., infrared radiation, such as near infrared light) from accessing the sensitive circuitry 6. In some embodiments, the obstructive material 4 can comprise a light-blocking material that is also a destructive material, such that the obstructive material 4 can prevent physical and electromagnetic access to the sensitive circuitry 6. In some embodiments, the obstructive material 4 can comprise a light-blocking material that is not also a destructive material. In other embodiments, the obstructive material 4 can comprise a destructive material that is not also a light-blocking material. In some embodiments, the obstructive material 4 can comprise a light-scattering, light diffusing or light filtering material.

In embodiments that utilize a destructive material for the obstructive material 4, the obstructive material 4 (which can comprise, e.g., a diamond based material like synthetic diamond, diamond-like carbon or industrial diamond, tungsten, a synthetic fiber, carbides (e.g., silicon carbide, tungsten carbide, boron carbide), borides (e.g., tungsten boride, rhenium boride, aluminum magnesium boride, etc.), boron nitride, carbon nitride, sapphire, and some types of ceramics or other suitably destructive material or combination of materials) can be provided adjacent to a bond interface 8. In some embodiments, particles of these destructive materials may be dispensed into a mixture to form the obstructive material 4. In various embodiments, the obstructive material 4 can be unpatterned and/or a blanket material layer, as opposed to a patterned layer. For example, the obstructive layer 4 can comprise a blanket layer over the entire obstructive element 3, or a blanket layer over the sensitive region 6 of the circuitry to be protected. A bonding layer 5 (e.g., a semiconductor material or inorganic dielectric) can be provided over the blanket layer of obstructive material 4. As explained herein, the obstructive material 4 can be directly bonded without an adhesive to a semiconductor element 2 to form a bonded structure 1 in various arrangements. As explained herein, the semiconductor element 2 can comprise any suitable type of semiconductor element, such as an integrated device die, an interposer, a semiconductor wafer, a reconstituted wafer, etc. The chosen obstructive material 4 may have a high shear modulus, a high bulk modulus and may not exhibit plastic deformation. For example, materials with a hardness of greater than 80 GPa (for example, as measured on the Vickers scale) can be used for the destructive material 4. In various embodiments, the destructive material can have a hardness of at least 12 GPa, at least 13 GPa, at least 15 GPa, at least 20 GPa, at least 30 GPa, or at least 50 GPa, as measured on the Vickers scale. For example, the destructive material can have a hardness in a range of 12.5 GPa to 150 GPa, in a range of 13 GPa to 150 GPa, in a range of 15 GPa to 150 GPa, in a range of 20 GPa to 150 GPa, in a range of 40 GPa to 150 GPa, or in a range of 80 GPa to 150 GPa as measured on the Vickers scale. In another example, the abrasive or destructive material may have a hardness higher than typical materials used in semiconductor chip. For example, hardness of the destructive material may be higher than that of Si, SiO, SiN, SiON, SiCN, etc. The obstructive material 4 may comprise one or more materials or layers deposited over one another in some embodiments. Moreover, the obstructive material 4 may comprise one continuous, non-continuous or patterned layer, or the obstructive material 4 may comprise several such continuous, non-continuous or patterned layers. In some embodiments, there may not be any circuitry or wiring within the obstructive material 4. In other embodiments, the obstructive material 4 may include electrical circuitry embedded in the material 4, or conductive vias partially or fully penetrating the obstructive material 4.

The obstructive or obstructive element 3 (e.g., a chip or chiplet) can be directly bonded (e.g., using dielectric-to-dielectric bonding techniques, such as the ZiBond® techniques used by Xperi Corporation of San Jose, Calif.) to at least sensitive areas 6 (for example, areas that include security-sensitive components) of an element 2 (such as a semiconductor chip) that can benefit from high security protection from third party tampering. For example, the dielectric-to-dielectric bonds may be formed without an adhesive using the direct bonding techniques disclosed at least in U.S. Pat. Nos. 9,391,143 and 10,434,749, the entire contents of each of which are incorporated by reference herein in their entirety and for all purposes. After the obstructive element 3 is direct bonded or hybrid bonded to the element 2 (e.g., a semiconductor chip or integrated device die), the one or more layers of the obstructive material 4 (which may comprise a destructive or abrasive material, a light-blocking material, a light scattering, a light filtering material, or a light diffusing material, etc.) may be positioned proximate the bond interface 8, for example, as close as possible to the bond interface 8. In one embodiment, the obstructive material 4 may be positioned less than 50 microns from the bond interface 8, less than 25 microns from the bond interface, or less than 10 microns from the bond interface 8, for example less than 5 microns from the bond interface 8. In various embodiments, the obstructive material 4 may be positioned in a range of about 1 micron to about 10 microns, or in a range of about 1 micron to about 5 microns, from the bond interface 8. In other embodiments, two or more obstructive elements 3 are directly bonded to the element 2.

In various embodiments, the direct bonds can be formed without an intervening adhesive. For example, the obstructive element 3 and the semiconductor element 2 can each have a bonding layer (such as bonding layer 5) with associated dielectric bonding surfaces. The respective dielectric bonding surfaces 9, 10 of the obstructive element 3 and the semiconductor element 2 can be polished to a high degree of smoothness. The bonding surfaces 9, 10 can be cleaned and exposed to a plasma and/or suitable chemistries (e.g., etchants) to activate the surfaces 9, 10. In some embodiments, the surfaces 9, 10 can be terminated with a species after activation or during activation (e.g., during the plasma and/or chemical processes). In various embodiments, the terminating species can comprise nitrogen. Further, in some embodiments, the bonding surfaces 9, 10 can be exposed to fluorine. For example, there may be one or multiple fluorine peaks near layer and/or bonding interfaces 8. Thus, in the directly bonded structures disclosed herein, the bonding interface 8 between two dielectric materials can comprise a very smooth interface with higher nitrogen content and/or fluorine peaks at the bonding interface 8.

In various embodiments, direct bonding of separately fabricated obstructive elements 3 facilitates using separate processing that cannot be directly applied to a fabricated integrated circuit or otherwise sensitive microelectronic element, due to thermal budget, chemical compatibility constraints or other technical reasons. For example, the obstructive materials 4 can be formed on a separate obstructive element 3 at a higher temperature than the direct bonding temperatures. The direct bonding process itself consumes relatively little thermal budget, including both room temperature initial covalent bonding between dielectric bonding layers, and possible annealing to strengthen the bonds and/or facilitate metal bonding in a hybrid bonding process.

If a third party attempts to remove the destructive material (e.g., an abrasive and/or hard material), the removal tools can be damaged (by abrasive obstructive materials) and/or the underlying active circuitry is damaged by the removal attempt. The obstructive material 4 can thus be "destructive" to either the removal tools or the protected circuit. Either result can introduce significant resistance to or entirely prevent reverse engineering, hacking, inspection, or other breach of the secured area, circuitry or devices.

In some embodiments, the obstructive material 4 can comprise an abrasive and/or destructive layer on a chiplet. Additionally or alternatively, the chiplet itself may comprise an abrasive and/or destructive material, and/or a hard material. Multiple abrasive and/or destructive materials may be combined in multiple layers or patterns within a layer to enhance the destructive effect. As explained above, the destructive material (e.g., abrasive and/or hard material) may be very close to the bond interface 8. For example, the destructive material may be positioned within 5 microns from the bond interface 8. The third party may attempt to etch or grind away the obstructive chiplet. If the destructive material is very close to the bond interface 8 between the obstructive element 3 (chiplet) and the semiconductor element 2, the method to remove or grind away the chiplet becomes significantly difficult.

In various embodiments, as explained above, the obstructive material 4 can alternatively or additionally comprise a light-blocking material configured to block light or electromagnetic waves. For example, the obstructive material 4 can be selected to block light at wavelengths in a range of 700 nm to 1 mm, in a range of 750 nm to 2500 nm, or in a range of 800 nm to 2500 nm. The obstructive material 4 can alternatively or additionally be selected or shaped to scatter incident light. The obstructive material 4 can alternatively or additionally be electrically conductive, and may effectively act as electromagnetic shield. In various embodiments, the obstructive material 4 can be selected to block near infrared (NIR) and focused ion beam (FIB) fault intrusion attempts. In another embodiment, the obstructive material 4 may comprise or may be deposited with one or more layers of optical or infrared filters. The thin film optical filters may act to filter out or modify the optical or IR light irradiated through them in either direction, e.g., light incident upon the circuit to trigger a response or the light emitted from the circuit to detect a response to a hacking technique.

In some embodiments, a portion of the security structure or circuit may be shared between the obstructive element 3 (e.g., the chiplet with the abrasive and/or destructive material) and the element 2 to be protected (e.g., the integrated device die with secure active areas 6). For example, a hybrid bonding technique can be used to provide conductor-to-conductor direct bonds along a bond interface 8 that includes covalently direct bonded dielectric-to-dielectric surfaces 9, 10. In various embodiments, the conductor-to-conductor (e.g., contact pad to contact pad) direct bonds and the dielectric-to-dielectric bonds can be formed using the direct bonding techniques disclosed at least in U.S. Pat. Nos. 9,716,033 and 9,852,988, the entire contents of each of which are incorporated by reference herein in their entirety and for all purposes.

For example, dielectric bonding surfaces 9, 10 can be prepared and directly bonded to one another without an intervening adhesive. Conductive contact pads (which may be surrounded by nonconductive dielectric field regions) may also directly bond to one another without an intervening adhesive. For example, in some embodiments, the respective contact pads can be flush with the surface of the dielectric surfaces 9, 10 or recessed below the dielectric field regions, for example, recessed in a range of 1 nm to 20 nm, or in a range of 4 nm to 10 nm. The bonding surfaces 9, 10 of the dielectric field regions can be directly bonded to one another without an adhesive at room temperature in some embodiments and, subsequently, the bonded structure 1 can be annealed. Upon annealing, the contact pads can expand and contact one another to form a metal-to-metal direct bond.

Additional details of obstructive elements 3 with obstructive materials 4 may be found throughout U.S. patent application Ser. No. 16/844,932 ("'932 Application"), and throughout U.S. Provisional Patent Application Nos. 62/833,491 ("'491 Application"); and 62/953,058 ("'058 Application"), the contents of each of which are incorporated by reference herein in their entirety and for all purposes. The embodiments disclosed herein can be used in combination with any of the embodiments disclosed in the '932 Application, the '491 Application, and the '058 Application.

FIG. 1A is a schematic side sectional view of an obstructive element 3, for use in forming a bonded structure in a die-to-wafer (D2W) or die-to-die (D2D) bonding process. In FIG. 1A, the obstructive element 3 includes a semiconductor (e.g., silicon) base or substrate 7 (also referred to herein as a carrier). In other embodiments, the substrate 7 for the security chiplet need not be a semiconductor, as it serves primarily as a carrier for an obstructive material 4 and bonding layer 5, as explained below, and can instead be other materials, such as glass or quartz. However, semiconductor substrates are provided in formats convenient for processing and handling with existing equipment and also with sufficient flatness and smoothness to simplify subsequent polishing of the bonding layer 5.

As shown, a security or obstructive material 4 can be provided over an exterior surface of the carrier or substrate 7. As explained herein, the obstructive material 4 can function to obstruct physical access to a protected circuit or sensitive circuit region 6, and can thus be considered an "obstructive material." As explained above, the obstructive material 4 can comprise an abrasive and/or destructive material (e.g., a material having a high mechanical hardness compared to the materials commonly used in semiconductor fabrication, such as silicon, silicon oxide, silicon nitride, aluminum and copper). The obstructive material 4 may be difficult to remove via standard techniques, for example, grinding, polishing, wet or dry etching, etc., when compared to the standard materials used in semiconductor fabrication. In various embodiments, the obstructive material 4 can additionally or alternatively be selected so as to block impinging electromagnetic radiation. The obstructive material 4 can comprise, for example, ceramic materials, composite materials, diamond, a combination of diamond and tungsten, or any other suitable type of obstructive material that can prevent external access to active circuitry on the semiconductor element 2 to which the obstructive element 3 is to be bonded. In various embodiments, the obstructive material 4 can comprise a material for which selective etchants may be unavailable to remove the obstructive material 4 without removing inorganic dielectrics common to semiconductor fabrication.

The obstructive material 4 can be fabricated and assembled onto the carrier or substrate 7 in a first facility at one or more first processing temperatures. For example, the obstructive material 4 may be deposited onto the carrier or substrate 7 at temperature(s) of at least 400° C., or at least 800° C., for example, in a range of 400° C. to 1000° C. or higher. Such high processing temperatures may not be suitable in foundries that are used to manufacture the semiconductor element 2, e.g., a wafer or an integrated device die (which after fabrication should not be exposed to temperatures of greater than 300° C., or greater than 400° C. for prolonged periods of time), because such high temperatures may damage the active circuitry 6 and other components of the semiconductor element 2. In some cases the materials employed for obstruction layers may be incompatible with semiconductor fabrication facilities due to concerns with contamination. Although only one layer of obstructive material 4 is shown in FIG. 1, two or more layers of the same or different obstructive materials as described above may be deposited. In some embodiments, an obstruction function may be performed by one layer of materials, while in some other embodiments, several layers of different materials (or of the same material) may serve to obstruct third party access to the sensitive circuitry 6. For example, several layers of materials having certain properties (e.g., refractive index) and thickness may be provided to introduce optical filtering, scattering or blocking functionality. In one embodiment, one or more such layers of obstructive materials 4 may be deposited on top of another one or more layers of destructive materials. In another embodiment, one or more such layers of obstructive materials 4 may be separated by one or more layers of standard semiconductor materials, for example, silicon, silicon oxide, silicon nitride, etc.

A bonding layer 5 can be provided on the obstructive material 4. In another embodiment, one or more buffer layers (not shown in FIG. 1A) may be deposited on the obstructive material 4, before depositing the bonding layer 5. One or more buffer layers may be used due to process limitations (e.g., low adhesion between bonding layer 5 and obstructive material 4), in which it may be challenging to directly deposit the bonding layer 5 on the obstructive material 4. The bonding layer 5 can include any suitable type of nonconductive or dielectric material, particularly inorganic dielectrics compatible with integrated circuit fabrication, such as silicon oxide, silicon nitride, etc. In some embodiments, a bonding layer 11 can also be provided on the semiconductor element 2. The bonding layer 5 (e.g., silicon oxide) can be thin such that the layer 5 does not adequately protect or shield the secure circuitry 6 from third party access. As shown in FIG. 1B, the obstructive element 3 can be directly bonded to the semiconductor element 2 without an adhesive. As explained herein, the respective bonding layers 5, 11 can be prepared for bonding. For example, the bonding layers 5, 11 can have bonding surfaces 9, 10 that are planarized to a high degree of surface smoothness and exposed to a terminating treatment (e.g., a nitrogen termination treatment). The bonding layers 5, 11 of the obstructive element 3 and the semiconductor element 2 can be brought into contact with one another at room temperature, and without application of an adhesive or voltage. The bonding layers 5, 11 can form a strong covalent bond along a bond interface 8. The strong covalent bonds may be sufficient for handling and even for post-bonding processing, such as grinding, polishing or otherwise thinning substrates, singulation, etc., but a post-bonding anneal can increase the strength of the bonds even further. In another embodiment, the bonding layer 11 can be directly bonded to the obstructive material 4, and the bonding layer 5 on the obstructive element 3 may not be provided.

As shown in FIG. 1B, a plurality of semiconductor elements 2 in some embodiments can be provided in wafer form as a wafer 2', and a plurality of singulated obstructive elements 3 can be directly bonded to the wafer 2' in a die-to-wafer (D2W) process. The wafer 2' can be singulated along saw streets S to form a plurality of bonded structures 1, each of which includes one or more obstructive elements 3 directly bonded to a singulated semiconductor element 2. In the illustrated embodiment, the obstructive elements 3 can be provided over sensitive areas of the semiconductor elements 2 so as to protect security-sensitive components 6 from external access. In some embodiments, the obstructive elements 3 can be provided over only a portion of the active surface of the semiconductor element 2. In other embodiments, the obstructive element 3 can be provided over an entirety of the semiconductor element 2. Beneficially, in the embodiment of FIGS. 1A and 1B, if a third party were to attempt to physically access the sensitive area(s) 6 of active circuitry, the obstructive material 4 would destroy or damage the tools used to remove the obstructive element 3. Alternatively, or additionally, attempts the remove the obstructive element 3 would destroy the underlying sensitive circuitry 6. Alternatively, or additionally, attempts to access the secure data, for example, via NIR triggering, may be prohibited due to the presence of obstructive element 3.

Unlike the D2W approach shown in FIGS. 1A-1B, various embodiments disclosed herein relate to wafer-to-wafer (W2W) processes for bonding (e.g., directly bonding) obstructive elements 3 to semiconductor elements 2. As explained herein, the obstructive elements 3 can comprise an obstructive material 4 configured to prevent external access to security-sensitive regions 6 of the semiconductor element 2. Beneficially, wafer-to-wafer bonding methods may be more cost effective than die-to-wafer (D2W) attachment or die-to-die (D2D) attachment methods. The security-sensitive areas 6 of the semiconductor element 2 may be small, and the obstructive materials 4 may be relatively low cost. However, due to the material properties of the obstructive material 4, it may be challenging to pattern the obstructive material 4 to expose bond or contact pads that provide electrical communication between the semiconductor element 2 and external devices such as substrates, interposers, other integrated devices, etc. For example, in various embodiments, contact pads of the semiconductor element 2 may be provided at or near (e.g., exposed through) the bonding layer 11 of the semiconductor element 2, which may face and/or be covered by the obstructive material 4 in some embodiments. However, if the obstructive material 4 covers the contact pads of the semiconductor element 2, it can be challenging to connect the contact pads to an external device (e.g., a substrate, interposer, integrated device die, etc.).

Accordingly, various embodiments disclosed herein enable wafer-to-wafer direct bonding of obstructive elements 3 having an obstructive material 4, while enabling electrical access to contact pads of the semiconductor element 2. As shown herein, various artifact structures can indicate a wafer-level bond in which the semiconductor element 2 and the obstructive element 3 formed part of respective wafers 2', 3' that were directly bonded prior to singulation. In various embodiments, the artifact structure comprises a first sidewall of the semiconductor element 2 being flush with a second sidewall of the obstructive element 3. The sidewalls of the singulated bonded structure can include markings indicative of a saw cut in some embodiments. In other embodiments, the sidewalls can include a pattern indicative of an etch process.

Figure 2B:
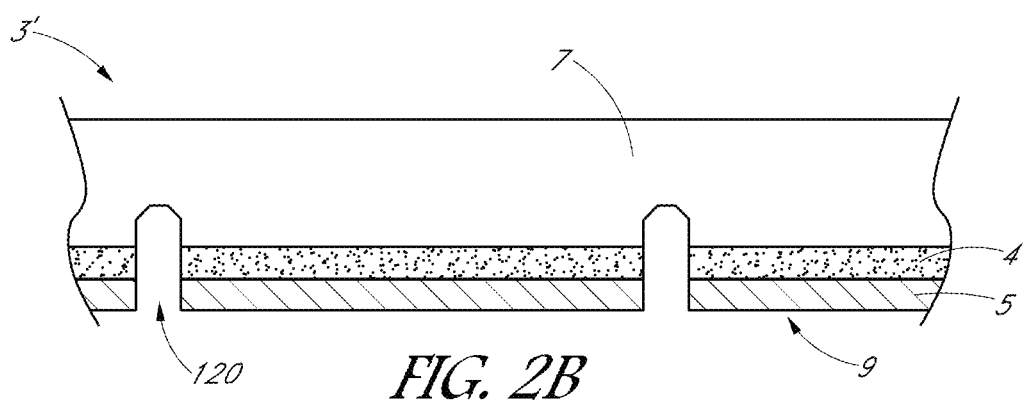
Figure 2C:
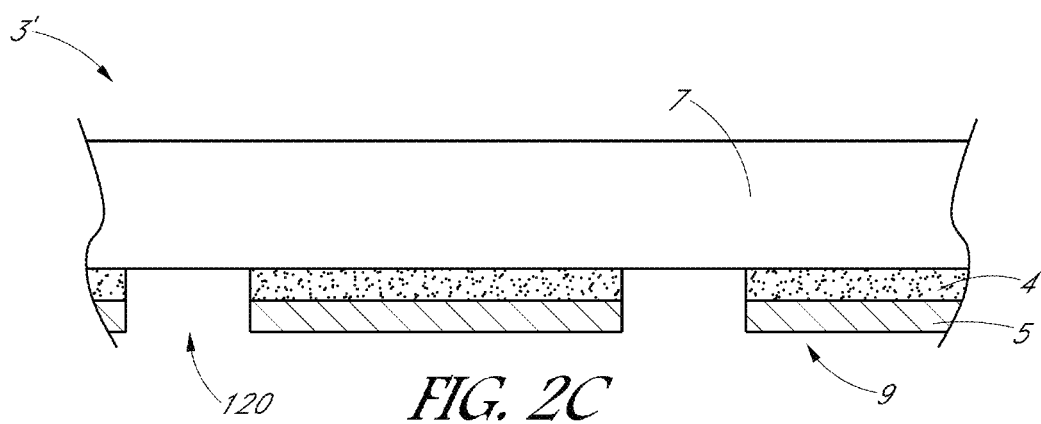
Figures 1, 2D:
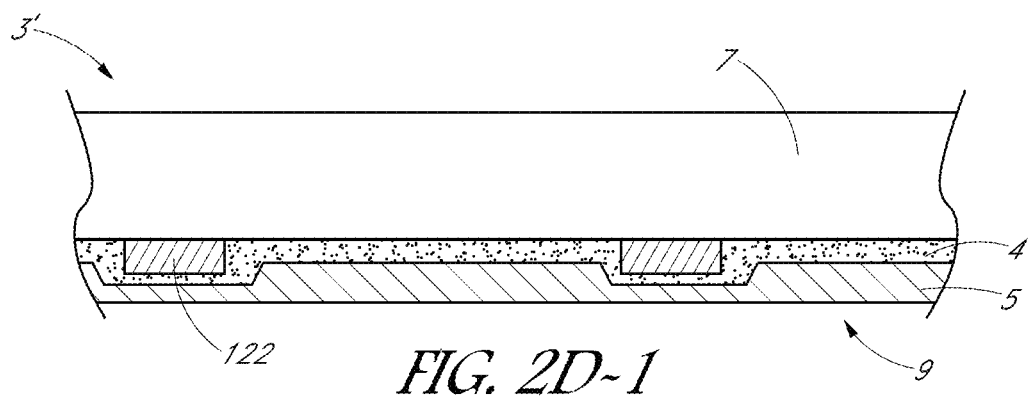

FIGS. 2A-2D-2 illustrate various examples of embodiments for such wafer-to-wafer bonding. As shown in FIG. 2A, the obstructive element 3' can comprise a wafer including a handle wafer 7 or base bulk material (such as silicon) and an obstructive or security material layer 4 on the handle layer or wafer 7. A bonding layer 5 (such as silicon oxide)

can be provided on the obstructive material layer 4 of the handle layer or wafer 7. The bonding layer 5 can be activated and terminated for direct bonding before or after the patterning as disclosed herein. In various embodiments, for example, the activation and termination can be performed after processing and prior to bonding. The W2W techniques disclosed herein can utilize the dielectric-to-dielectric direct bonding techniques and/or the hybrid bonding techniques (which can include dielectric-to-dielectric and conductor-to-conductor direct bonds) described herein. It should be appreciated that, although various embodiments disclosed herein may illustrate only a portion of the wafer 3', e.g., a portion corresponding to one obstructive element before singulation, the wafer can be singulated to form numerous (e.g., hundreds, thousands, etc.) singulated obstructive elements.

Turning to FIG. 2B, a trench 120 can be formed through the bonding layer 5, the obstructive material 4, and a portion of the handle wafer layer 7 by a partial saw cut. The saw used for the partial saw cut can comprise a material and structure sufficiently hard so as to cut through the obstructive material 4. In the embodiment of FIG. 2B, a sidewall of the trench 120 can comprise respective side surfaces of a portion of the handle wafer 7, the obstructive material 4, and the bonding layer 5. The side surfaces of the portion of the handle wafer 7, the obstructive material 4, and the bonding layer 5 can include markings indicative of the saw process.

In the example of FIG. 2C, a patterned subtractive removal can be used to create the trench 120 or opening(s) in the bonding layer 5 and the obstructive material 4. For example, in FIG. 2C, the bonding layer 5 and the obstructive material 4 can be etched to expose locations that will correspond to bond pad locations (see FIG. 2E) in the underlying semiconductor element 2 to which the obstructive element 3' is directly bonded. The trench 120 shown in FIGS. 2B and 2C can comprise a continuous peripheral ring or a plurality of blind vias or holes. In the embodiment of FIG. 2C, a sidewall of the trench 120 can comprise respective side surfaces of the obstructive material 4 and the bonding layer 5. The side surfaces of the obstructive material 4 and the bonding layer 5 can include an etch pattern indicative of an etching process.

Figures 2, 2D:
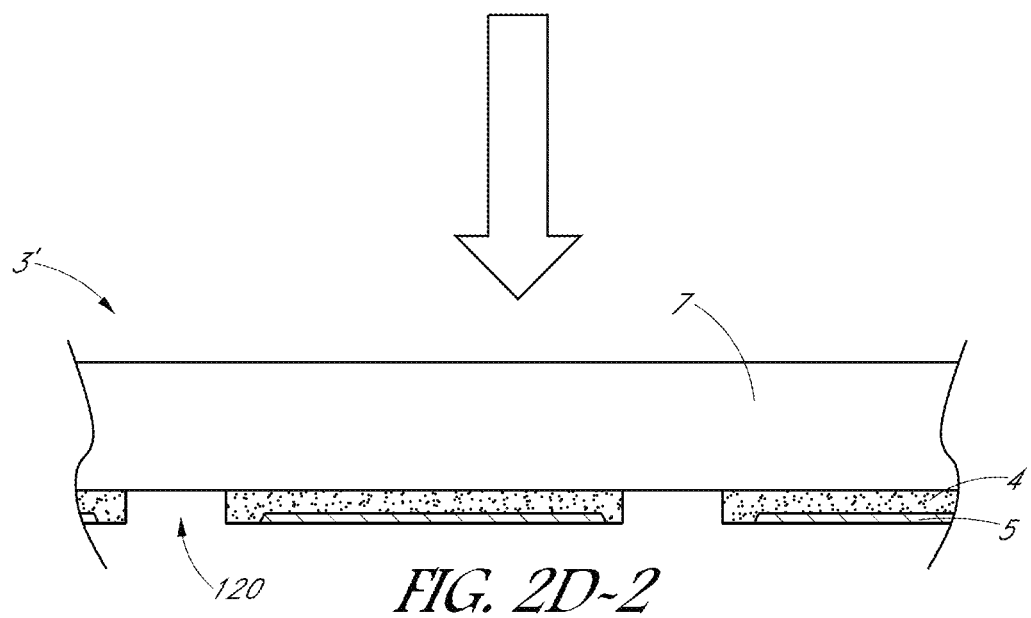

In FIGS. 2D-1 and 2D-2, an additive material 122 (which may also be a sacrificial material in FIG. 2D-2) can be provided in a pattern on the handle layer 7 as shown in FIG. 2D-1. The obstructive material 4 can be provided over the handle layer 7 and over the additive material 122, followed by deposition of the bonding layer 5 over the obstructive material 5. As shown in FIG. 2D-1, in some embodiments, the obstructive material 4 can be conformally deposited over the additive material 122. The additive material 122 can be any suitable sacrificial material that can be selectively removed, such as a dielectric material, a photoresist material, etc.

As shown in FIG. 2D-2, the bonding layer 5 and portions of the obstructive material 4 can be grinded or otherwise removed to expose the additive material 122 over the obstructive material 4. The additive material 122 can be removed in any suitable manner (e.g., by selective etching) to expose a trench 120 that corresponds to bond pad locations of the semiconductor element 2 after the obstructive element after the obstructive element 3 and the semiconductor element 2 are directly bonded. In this embodiment, the sidewalls of the trench 120 can be covered by the obstructive material 4 as shown in FIG. 2D-2.

Figure 2E:
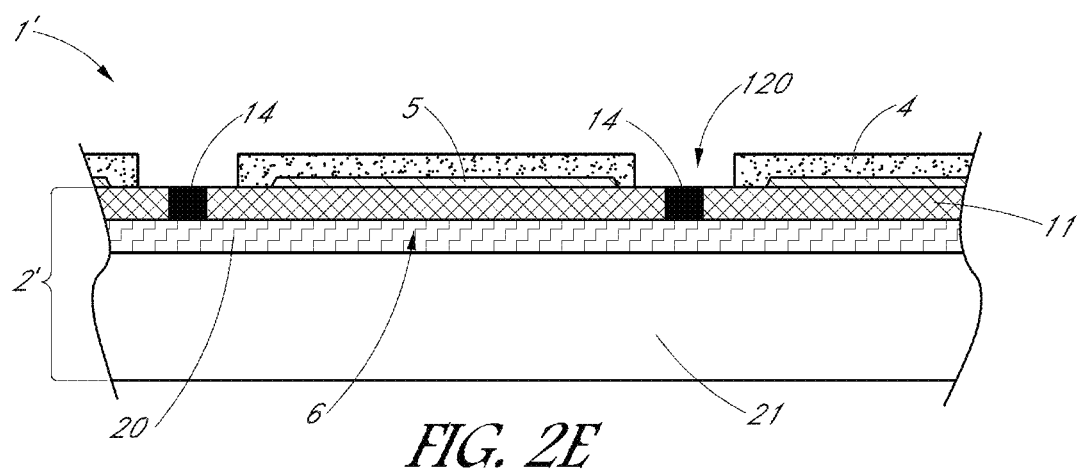

Turning to FIG. 2E, the obstructive element 3' of FIG. 2D-2 in wafer form can be directly bonded to a semiconductor element 2' in wafer form to form a bonded structure 1' in wafer form. The semiconductor element 2' can include a substrate 21, an active device region 20 (or layer) having sensitive circuitry 6, and a bonding layer 11, as explained above. The handle layer 7 of the obstructive element 3' can be removed after the direct bonding in some embodiments to form the bonded structure 1' shown in FIG. 2E. As shown in FIG. 2E, the trench 120 formed through the obstructive material 4 can be aligned with and disposed over contact pads 14 in the semiconductor element 2. The trench 120 can provide access to the bond or contact pads 14, for example, by way of bonding wires. Although FIG. 2E illustrates the bonded structure 1' resulting from bonding the obstructive element 3' of FIG. 2D-2 to a semiconductor element 2', it should be appreciated that the obstructive elements 3' of FIGS. 2B and 2C an likewise we bonded to semiconductor element 2' in a similar manner such that the trench 120 exposes the contact pads 14 of the semiconductor element 2'.

As explained herein, the semiconductor element 2' in wafer form can be singulated after directly bonding the obstructive element 3' to form a plurality of singulated bonded structures 1. The singulated bonded structure 1 can include a corresponding artifact structure indicative of a wafer-level bond in which the semiconductor element 2 and the obstructive element 3 formed part of respective wafers 2', 3' directly bonded prior to singulation. For example, the artifact structure can comprise markings (e.g., saw markings) along the sides of the obstructive element 3 (e.g., the obstructive layer 4) and the semiconductor element 2 (e.g., the device region 20 and/or substrate 21) indicative of a singulation process after bonding. Moreover, the artifact structure can comprises a first sidewall of the semiconductor element 2 being flush with a second sidewall of the obstructive element 3 (e.g., the obstructive material 4). In addition, the trench 120 can extend through the obstructive material 4 to the bond interface 8. Further, as shown in FIGS. 2D-2 and 2E, a thickness of the obstructive material 4 at a first location near the bond pad 14 (e.g., adjacent or surrounding the bond pad 14) can be greater than a thickness of the obstructive material 4 at a second location (e.g., between bond pads) that is farther from the bond pad 14 than the first location.

Figure 3A:
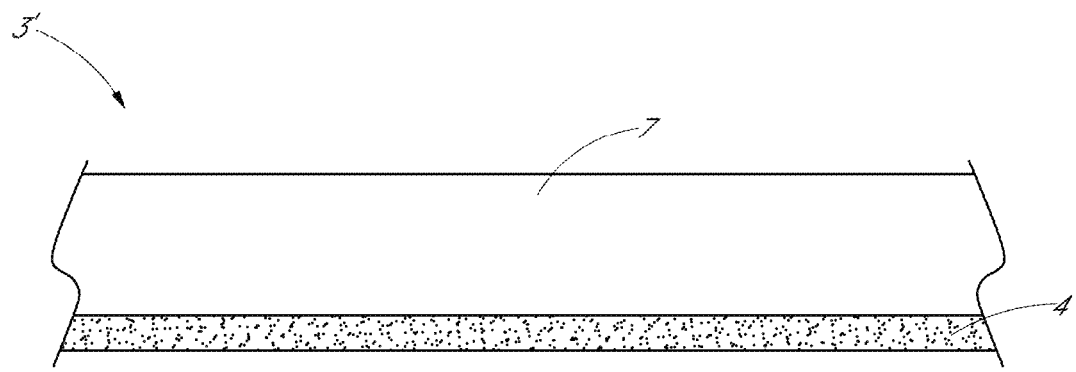
FIGS. 3A-3H are schematic side sectional views illustrating a process flow for forming a bonded structure using a pad cut W2W technique, according to another embodiment.
Figure 3B:
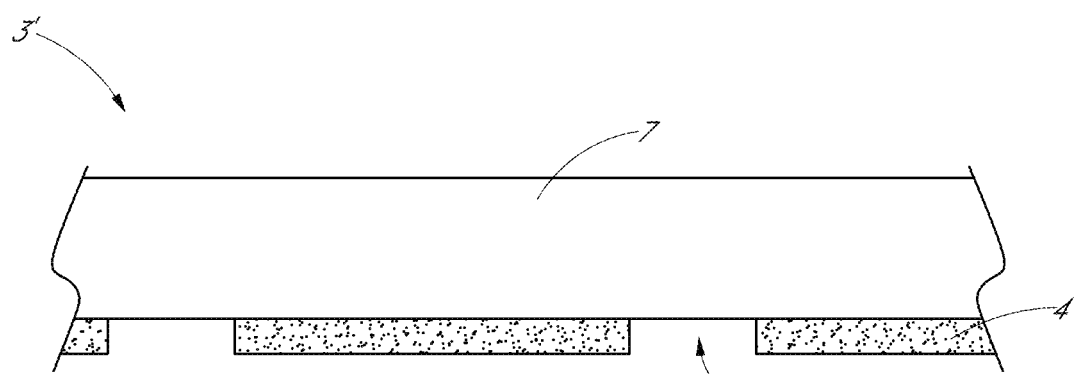
Figure 3C:
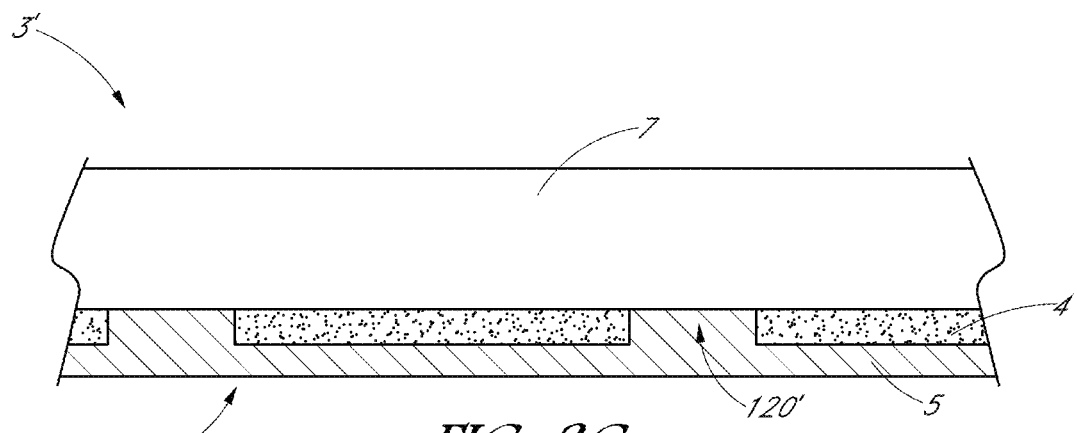
Figure 3D:
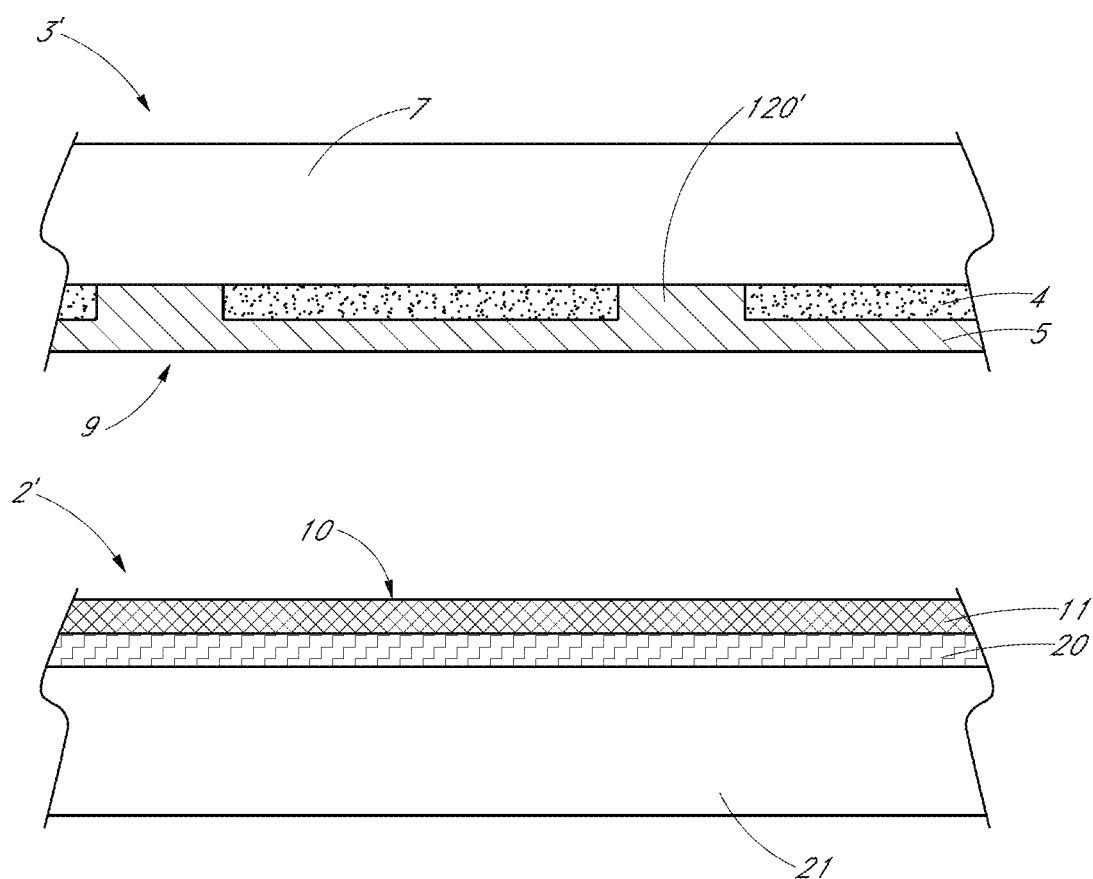

In another embodiment, a pad cut process can be used to expose the contact pads 14 after directly bonding the obstructive element 3' and the semiconductor element 2' in wafer form. As shown in FIG. 3A-3H, a trench 120' can be formed in the obstructive material 4 (see FIG. 3B) in any suitable manner (e.g., etching, sawing, etc.). After the trench 120 is formed in the obstructive material 4 (and possibly the handle wafer 7), the bonding layer 5 can be deposited (e.g., conformally deposited in some embodiments) over the obstructive material 4, including within the trench 120' as shown in FIG. 3C. The bonding layer 5 can be planarized (for example, using chemical mechanical polishing or CMP) to form a planar bonding surface 9 as shown in FIGS. 3C and 3D. In the embodiment of FIG. 3C, the sidewalls of the trench 120' can be covered by bonding material 5 as shown in FIG. 3C prior to directly bonding. The trench 120' may be empty before bonding and may be filled with the bonding layer 5 and planarized before bonding.

Figure 3E:
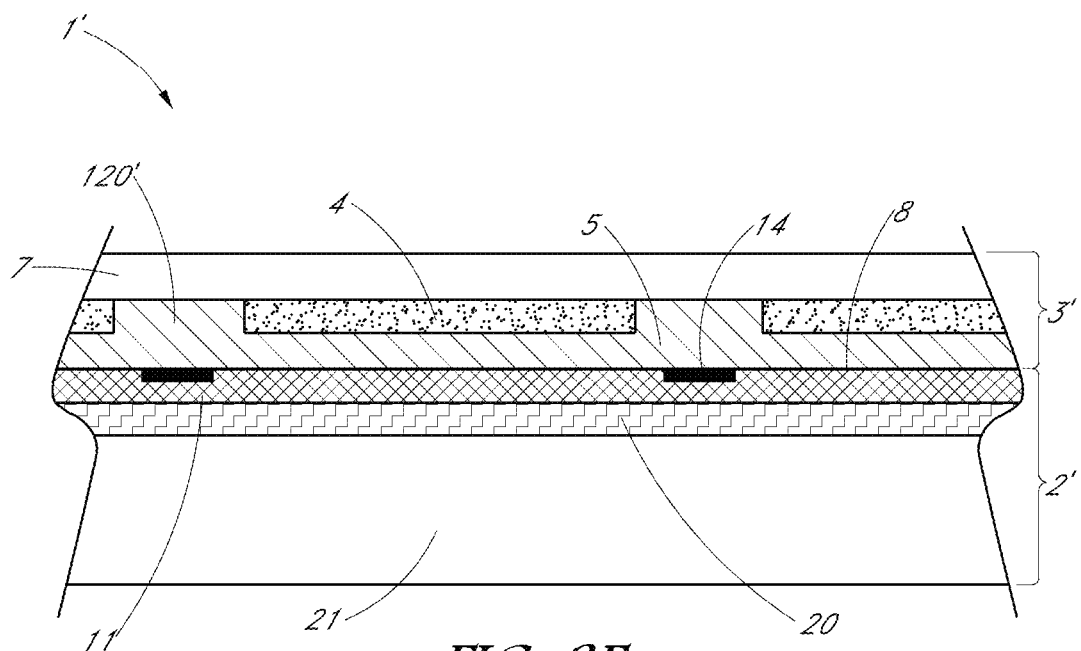
Figure 3F:
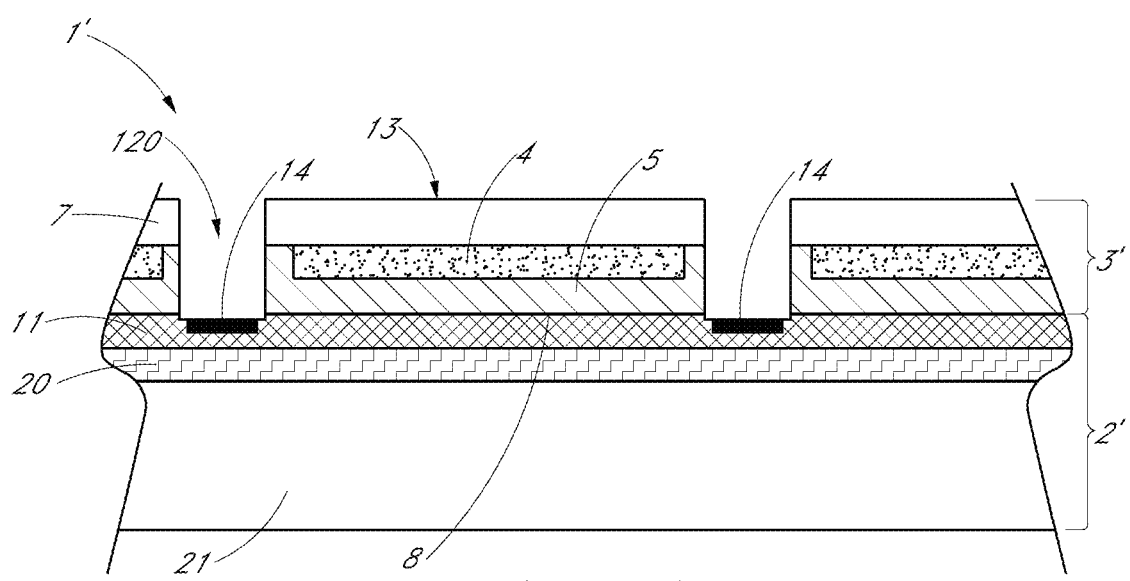

In FIGS. 3A-3H, the bond pads 14 of the semiconductor element 2' can be exposed after the obstructive element 3' is directly bonded to the semiconductor element 2' in wafer form. In FIG. 3D, the bonding surfaces 9, 10 of the obstructive element 3' and semiconductor element 2' can be prepared for bonding as described above. The bonding surfaces 9, 10 can be brought together to form a direct bond along a bond interface 8 as shown in FIG. 3E. In FIG. 3F, after directly bonding the obstructive element 3' and the semiconductor element 2' in wafer form, a trench 120 can be formed through a back side 13 of the obstructive element 3' using any suitable material removal process (e.g., etching, etc.). The trench 120 can be in alignment with previously patterned front side trenches 120' or openings (see FIGS. 3B-3D) with a subsequently formed inorganic dielectric bonding layer 5 (e.g., comprising silicon oxide) that also lines the prior trench/opening 120'. As shown, the bonding layer 5 can comprise a liner that extends back towards the back side 13 of the protective element 3 along a vertical sidewall of the trench 120. As illustrated, the bonding layer 5 can terminate at the handle layer 7 and does not extend to the back side 13 of the obstructive element 3 in FIG. 3F. The bonded structure 1' in wafer form can be singulated to form bonded structures 1.

Thus, the resultant opening or trench 120 in the bonded structure 1' includes an inorganic dielectric bonding layer 5 that does not fully extend to the back side 13 of the handle or base bulk material 7 (now front side of the bonded structure 1'). In locations where the pad cut does not intersect a front side opening or trench 120', the backside pad cut 120 represents a shallower groove in the back side 13 of the handle or base bulk material 7 that does not expose the semiconductor element 2'. The backside pad cut may comprise a via or a trench. If the pad cut is a via extending through the obstructive element 3', the pad cut 120 can intersect the front side opening or trench 120' to expose the pads 14 for bonding. The front side opening or trench 120' may be a continuous ring or blind vias or holes. If the pad cut forms a trench 120 and the front side opening or trench 120' is a via or hole, there may be an area (not above the wire bond pads 14) where the backside pad cut comprises a shallow groove. The combination of the front side opening or trench 120' and the back side pad cut to form the final backside trench 120 can extend to the bond pads 14 of the semiconductor element 2'.

Figure 3G:
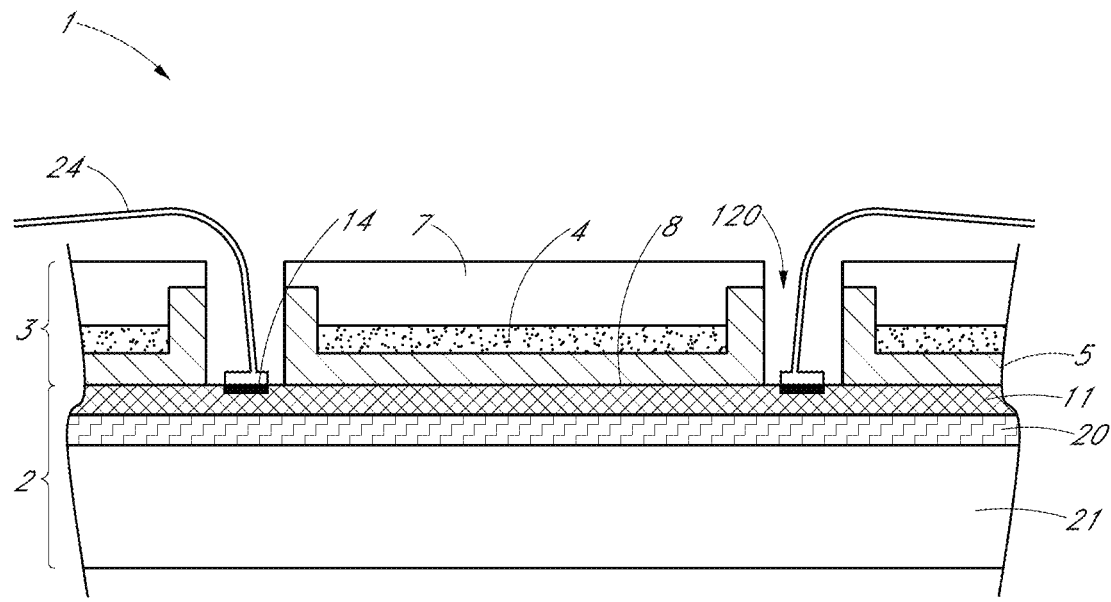
Figure 3H:
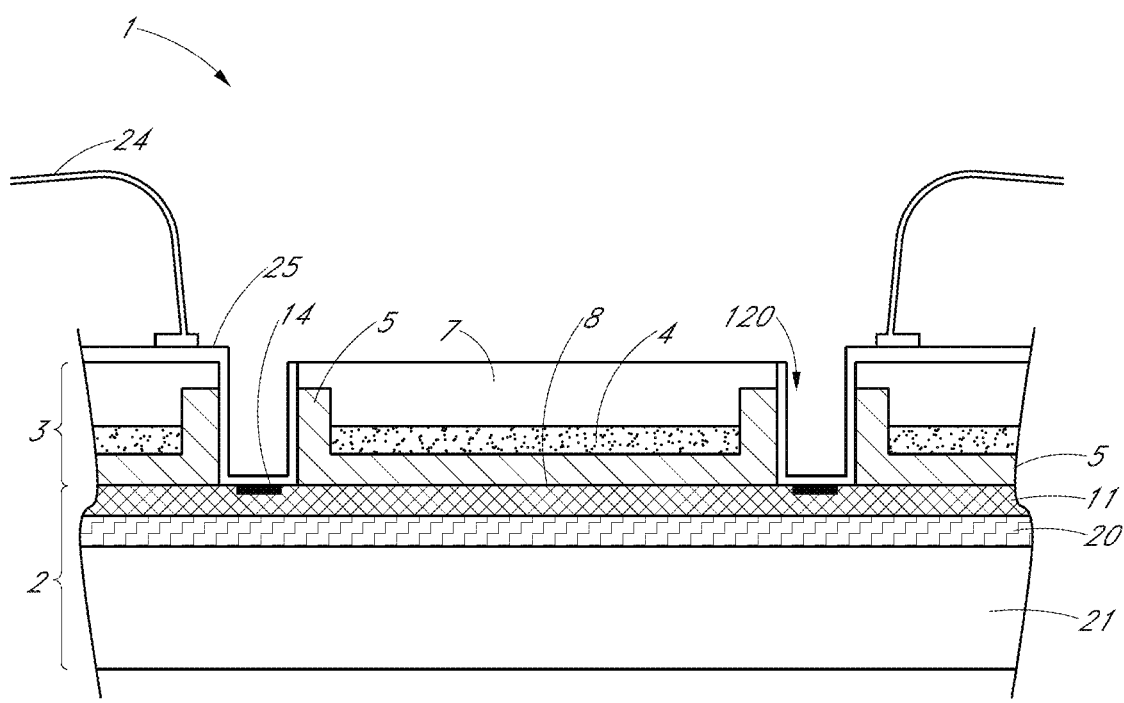

As shown in the singulated bonded structure 1 of FIG. 3G, in some embodiments, a bonding wire 24 can extend into the trench 120 to electrically connect to the bond or contact pads 14 of the semiconductor element 2. In other embodiments, as shown in the singulated bonded structure 1 of FIG. 3H, a trace 25 can be provided to connect the bond pads 14 to an upper surface of the obstructive element 3, and the bonding wire 24 can connect to the trace 25 at the upper surface.

Figure 4A:
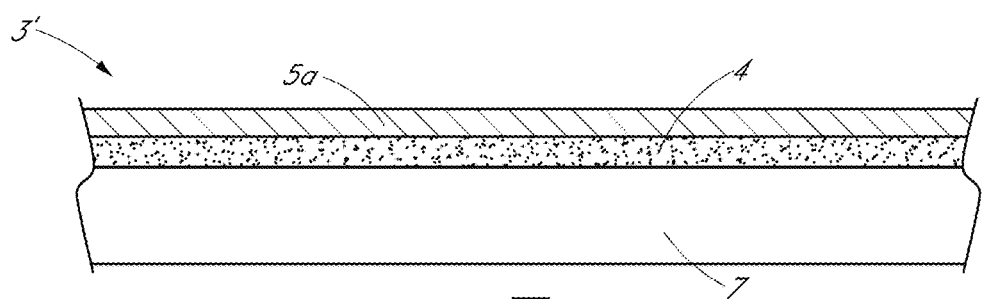
FIGS. 4A-4F are schematic side sectional views illustrating a process flow for forming a bonded structure using a post-bond etchback technique, according to another embodiment.
Figure 4B:
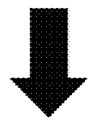
Figure 4B:
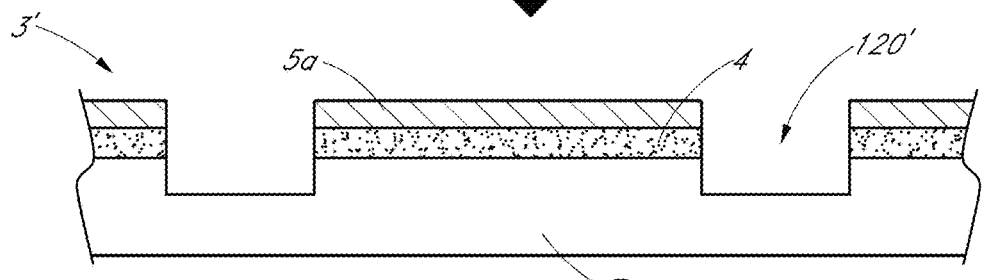
Figure 4C:
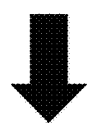
Figure 4C:
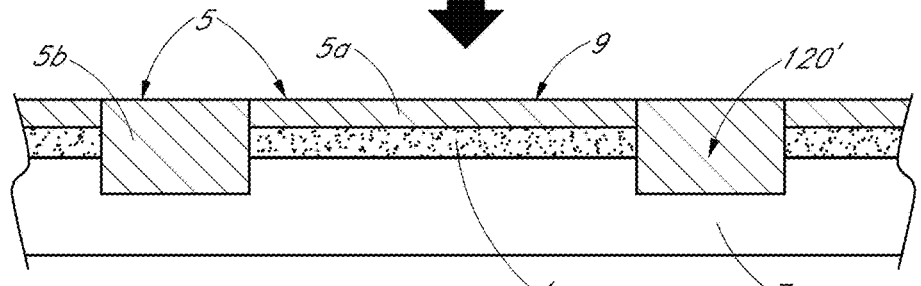

FIGS. 4A-4F illustrate a post-bond etchback process or silicon thinning process is used followed by a pad cut process (e.g., a dry or wet etch) to etch away edges of the obstructive element 3' to expose the bond pads 14 of the lower semiconductor element 2'. In some embodiments, as shown in FIGS. 2A to 3H, a complete edge of the obstructive element 3 is not exposed, and one or more trenches 120, vias or holes are etched, sawn, or otherwise formed into the obstructive element 3' to expose the bond pads 14 of the semiconductor element 2'. As shown in FIG. 4A, an obstructive material 4 and a first dielectric layer 5a can be provided on a handle layer 7. In FIG. 4B, the obstructive element 3' in wafer form can be partially singulated or partially etched to form trenches 120' through the first dielectric layer 5a, the obstructive material 4 and partially through the handle layer 7. In FIG. 4B, the trench 120' can comprise saw markings or an etch pattern indicative of a saw cut or etch pathway extending towards the back side of the obstructive element 3. Turning to FIG. 4C, a second dielectric layer 5b can be deposited inside the trenches 120' and over the obstructive material 4 for form a dielectric bonding layer 5 (which can include the layers 5a, 5b). The deposited dielectric bonding layer 5 can be planarized and polished, activated and terminated for direct bonding as described herein.

Figure 4D:
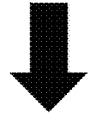
Figure 4D:
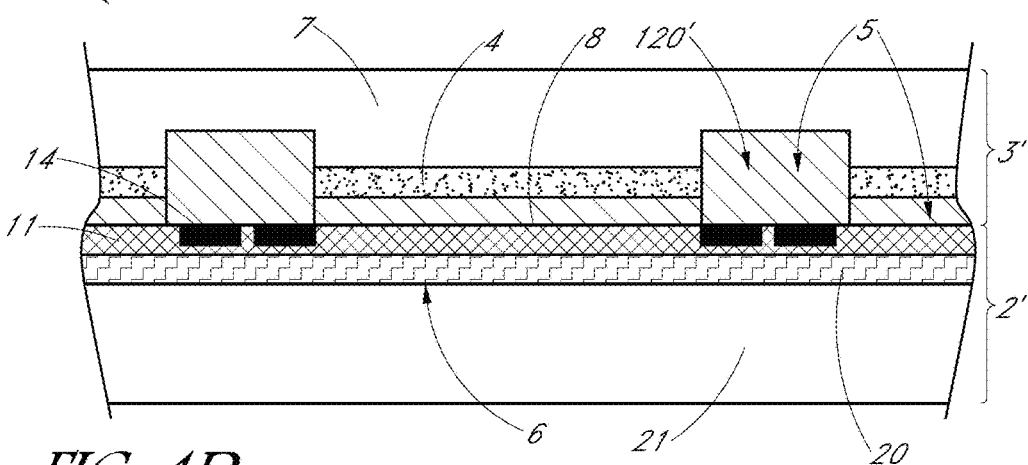
Figure 4E:
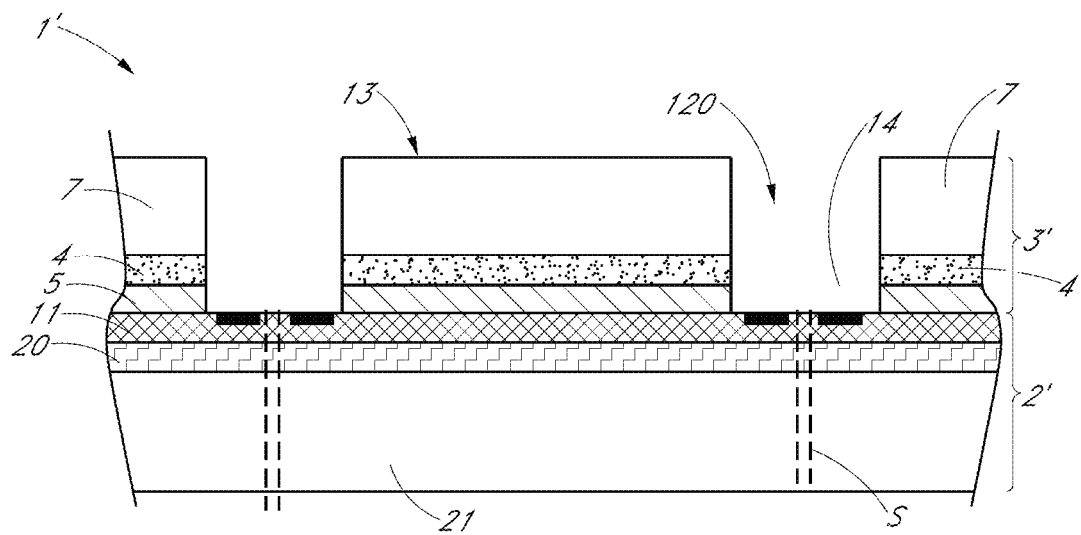
Figure 4F:
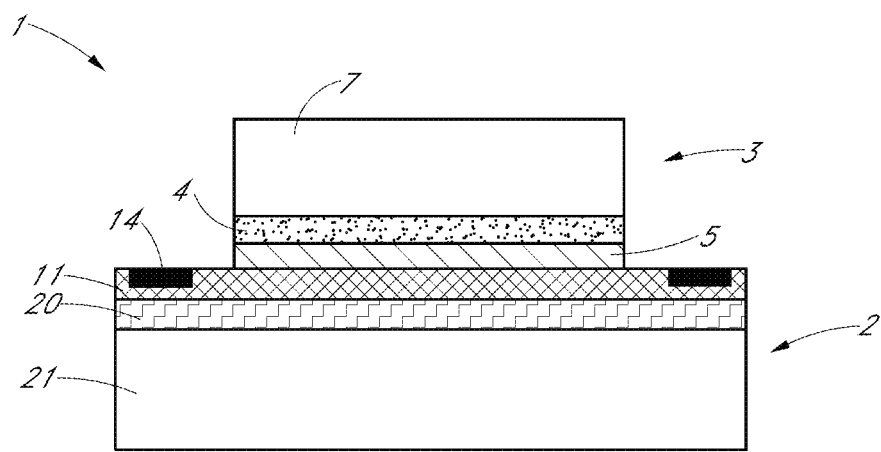

As shown in FIG. 4D, the obstructive element 3' in wafer form can be directly bonded to the semiconductor element 2' in wafer form without an adhesive. In FIG. 4E, portions of the backside handle bulk layer 7 and the dielectric layer 5 filling the trench 120' can be removed, for example, by a combination of one or more of grinding, planarizing and/or etching so as to form a trench 120 or opening from the back side 13 of the obstructive element 3' that exposes the bond or contact pads 14 of the semiconductor element 2'. Metal layers of the semiconductor element 2 (or other layers) can serve as an etch stop during oxide (or other inorganic dielectric) etch in some embodiments. Turning to FIG. 4F, side edges of the obstructive element 3'can be removed in some embodiments to further expose the bond pads 14 of the underlying semiconductor element 2'.

As shown in FIG. 4F, the semiconductor element 2' in wafer form can be singulated along saw streets S (see FIG. 4E) after direct bonding to form a plurality of singulated bonded structures 1. In FIG. 4F, the obstructive material 4 can be disposed between the bonding layers 5, 11 and the substrate or handle 7 (see also, e.g., FIGS. 3F and 6E). In some embodiments, therefore, the artifact structure can include saw markings along a side surface of the semiconductor element 2. In other embodiments, the artifact structure can include an etch pattern indicative of singulation. In the etchback structure of FIG. 4F, side surfaces of the obstructive element 3 can comprise etch patterns indicative of the etching of the sides of the element 3. For example, the side surfaces of the obstructive element 3 can comprise etch patterns indicative of an etch pathway extending away from the back side 13 of the obstructive element 3 and towards the bond interface 8. Beneficially, the pre-bond partial singulation cut of the embodiment shown in FIGS. 4A-4F can obviate a post-bonding removal of the obstructive material 4.

Figure 5A:
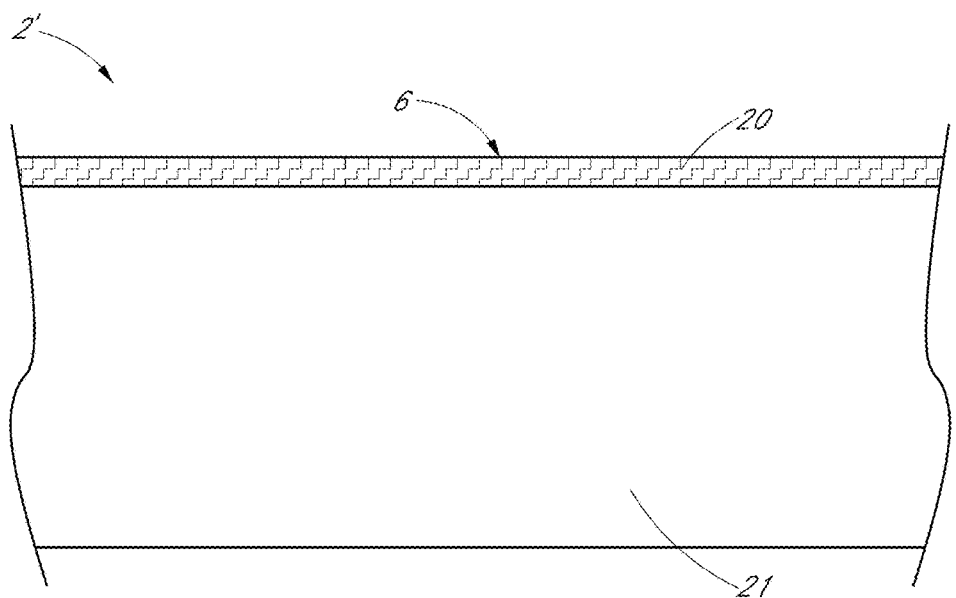
FIGS. 5A-5F are schematic side sectional views illustrating a process flow for forming a bonded structure using a sacrificial handle wafer, according to another embodiment.
Figure 5B:
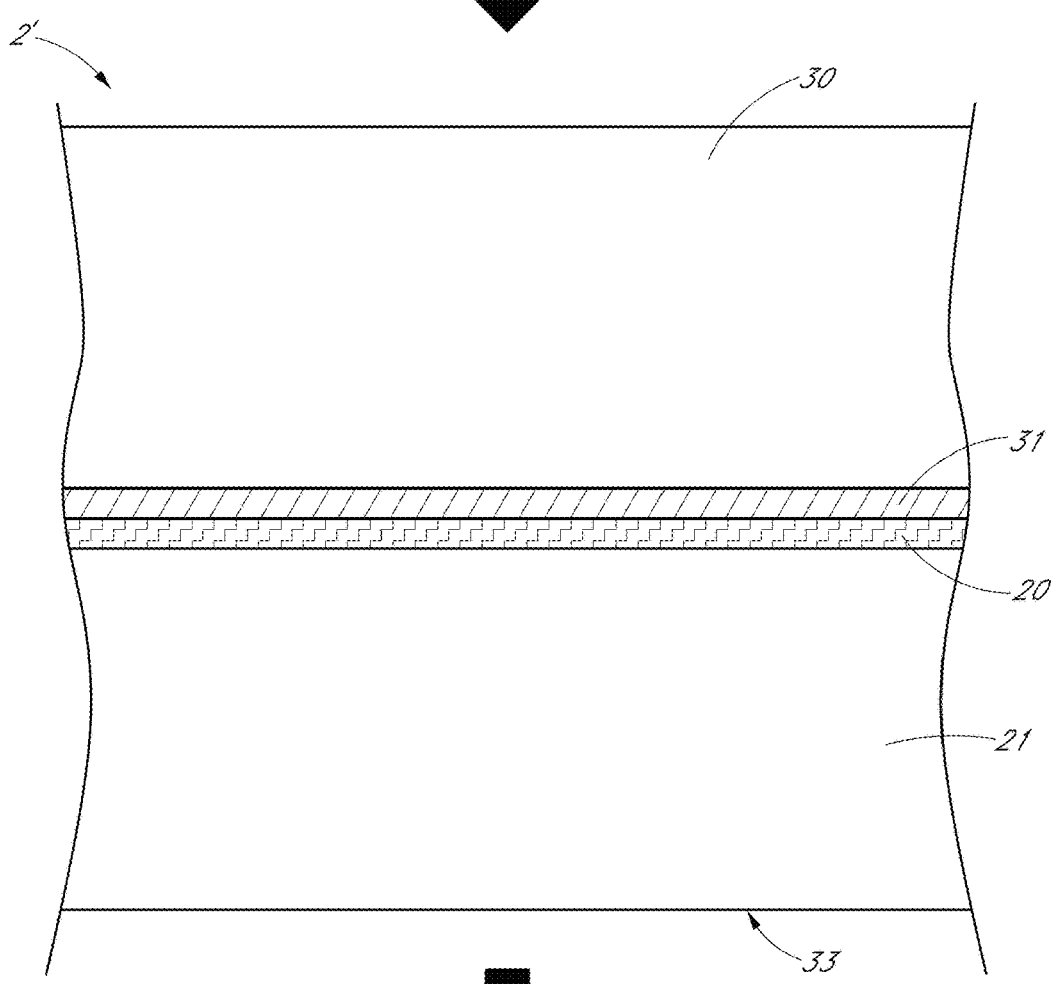

FIGS. 5A-5F illustrate another process flow for wafer-to-wafer bonding of obstructive elements 3' in wafer form to active semiconductor elements 2' in wafer form. As shown in FIG. 5A, an active semiconductor element 2' in wafer form (e.g., a silicon wafer but can be other materials) can be provided. The semiconductor element 2' can include a substrate 21 and active device region or layer 20 as explained above. As shown in FIG. 5B, a handle wafer 30 can be bonded (for example, in a face-to-face, or F2F, manner) with the active semiconductor element 2' in wafer form. In some embodiments, an adhesive 31 can be used to temporarily bond the handle wafer 30 to the semiconductor element 2. In other embodiments, the handle wafer 30 and active semiconductor element 2 can be directly bonded without an adhesive to have a strength sufficient to withstand a subsequent thinning process, but can be removed or debonded, for example, by etching, grinding, polishing, exposing to a plasma, etc.

Figure 5C:
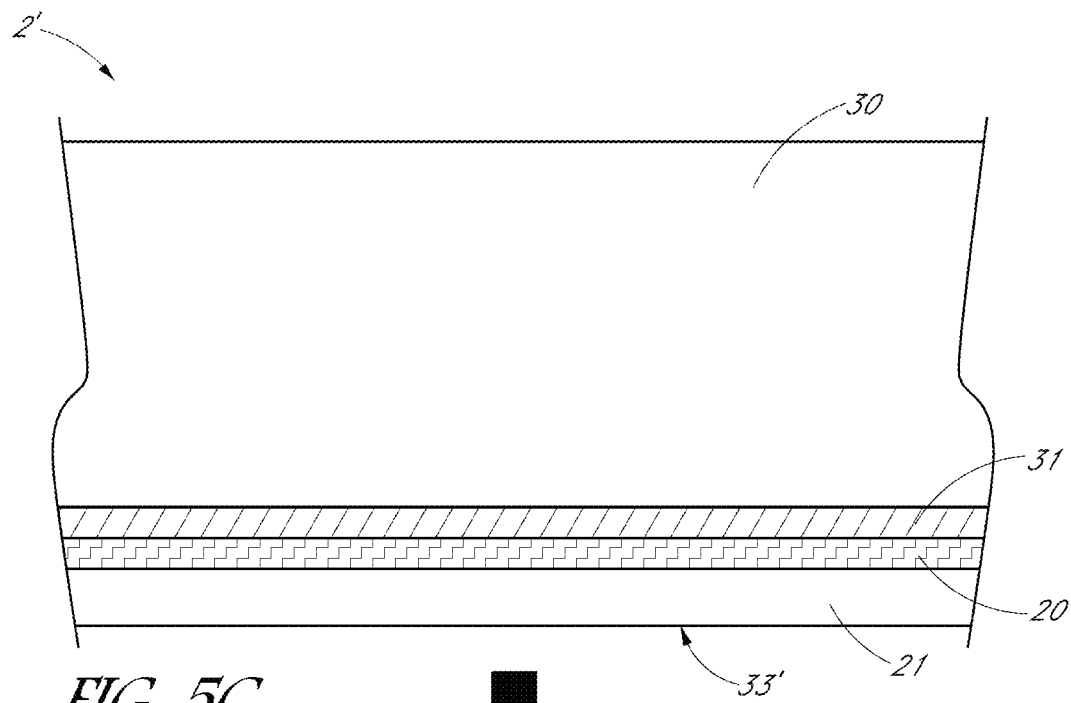
Figure 5D:
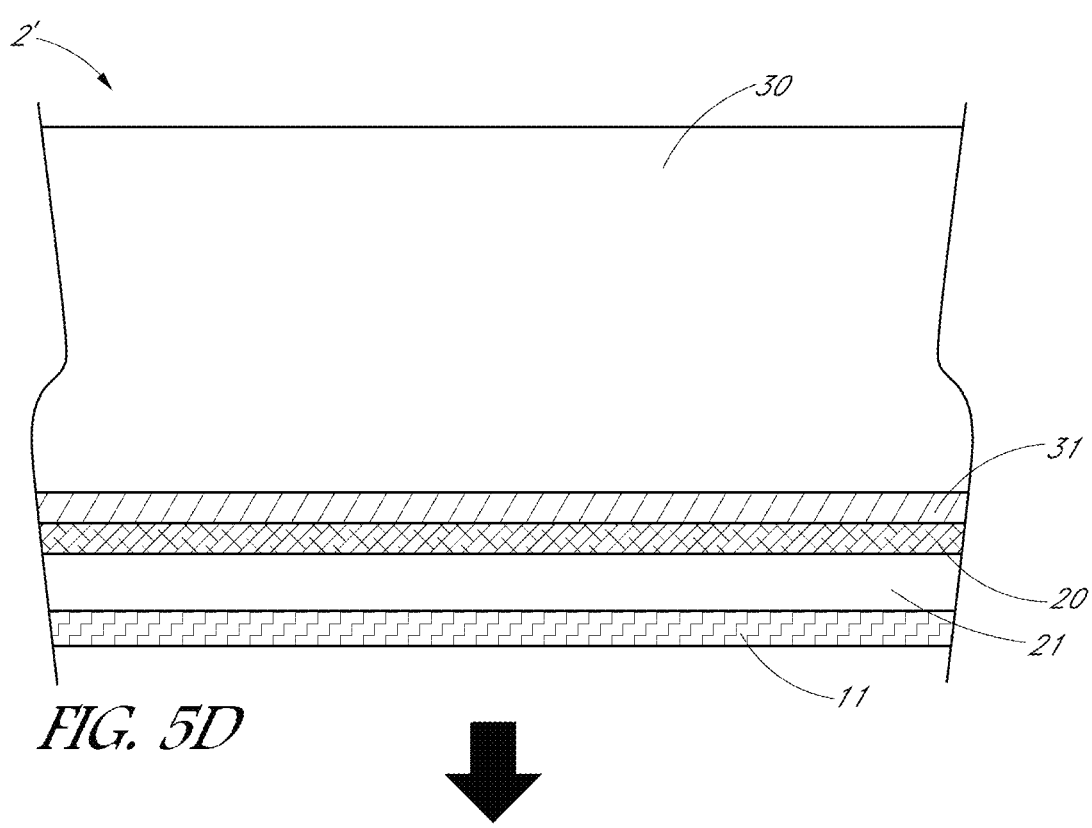
Figure 5E:
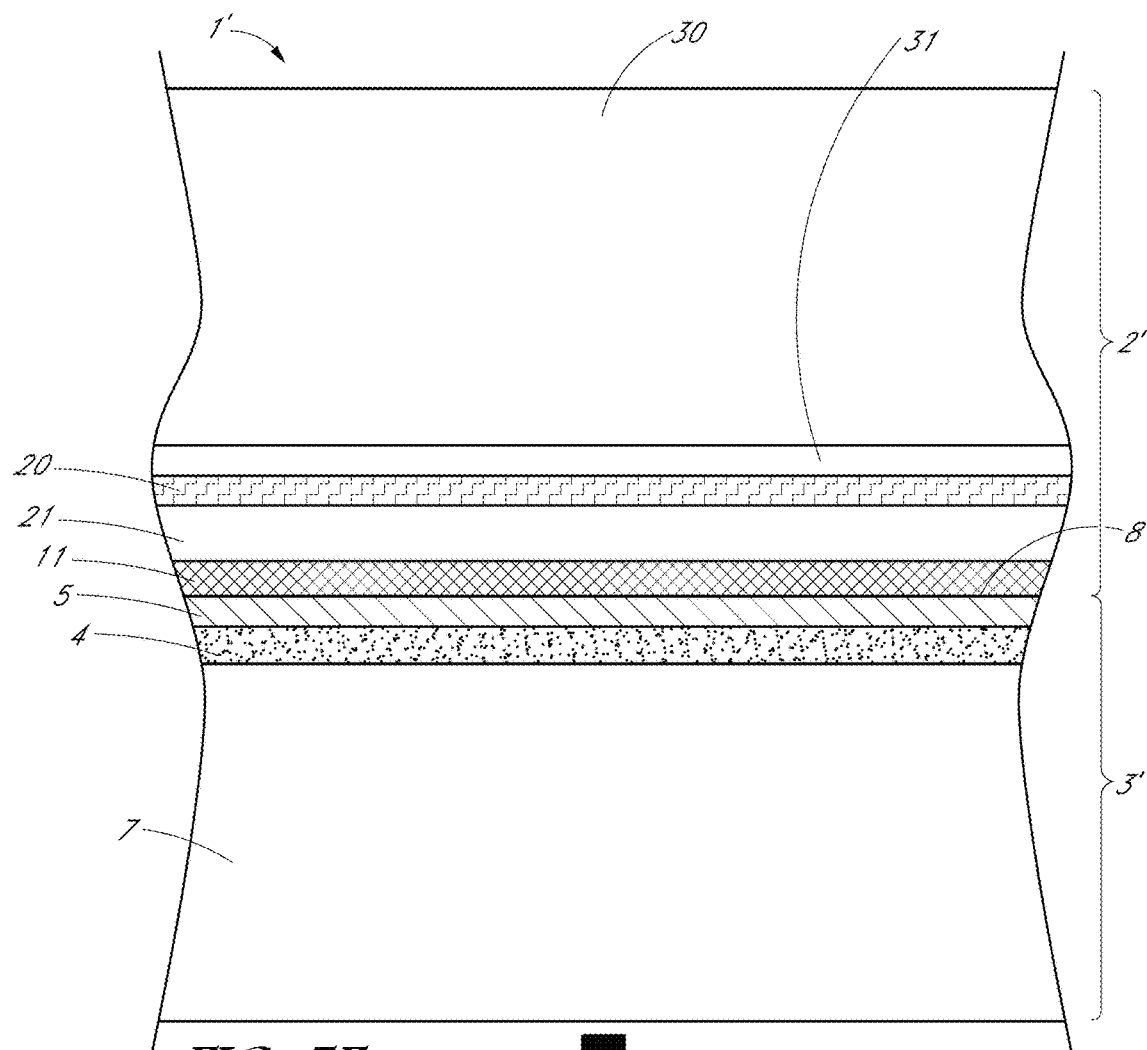
Figure 5F:
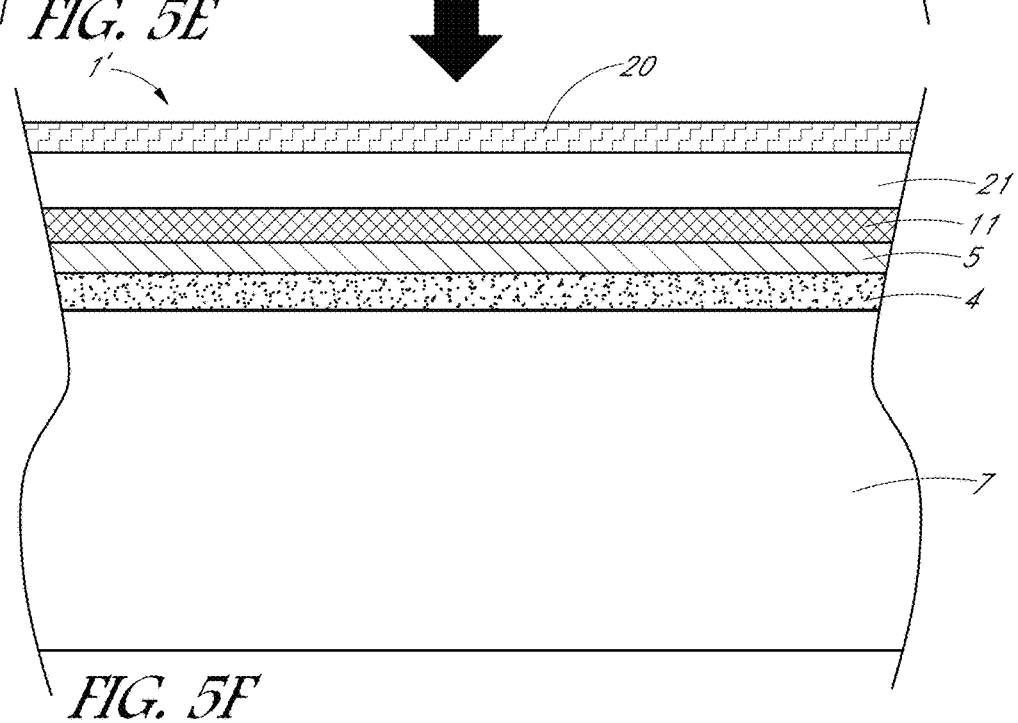

Turning to FIG. 5C, the backside 33 of the active semiconductor element 2' can be thinned down to a reasonably low thickness without affecting the active circuits. For example, the semiconductor element 2' can be grinded, polished, or etched to thin the semiconductor element 2'. A dielectric bonding layer 11 (such as silicon dioxide) can be deposited on the thinned backside 33' of the active semiconductor element 2'. The dielectric layer 11 can be polished using, for example, a chemical mechanical polishing (CMP) process. As shown in FIG. 5E, the polished dielectric layer 11 on the backside 33' of the active semiconductor element 2' can be directly bonded to an obstructive element 3' in wafer form, including a layer of obstructive material 4, without an adhesive to form a bonded structure 1' in wafer form. After direct bonding, in FIG. 5F, the handle wafer 30 (and adhesive 31) can be removed. The bonded structure 1' in wafer form can be singulated to form a plurality of singulated bonded structures 1. As shown in FIG. 5F, the upper surface of the active region or layer 20 can be exposed so as to allow access to bond pads, in various embodiments. In FIG. 5F, the bulk semiconductor region 21 can be disposed between the active semiconductor region 20 and the bonding layers 11, 5. The obstructive material 4 can be disposed between the bonding layers 11, 5 and the substrate or handle 7.

Figure 6D:
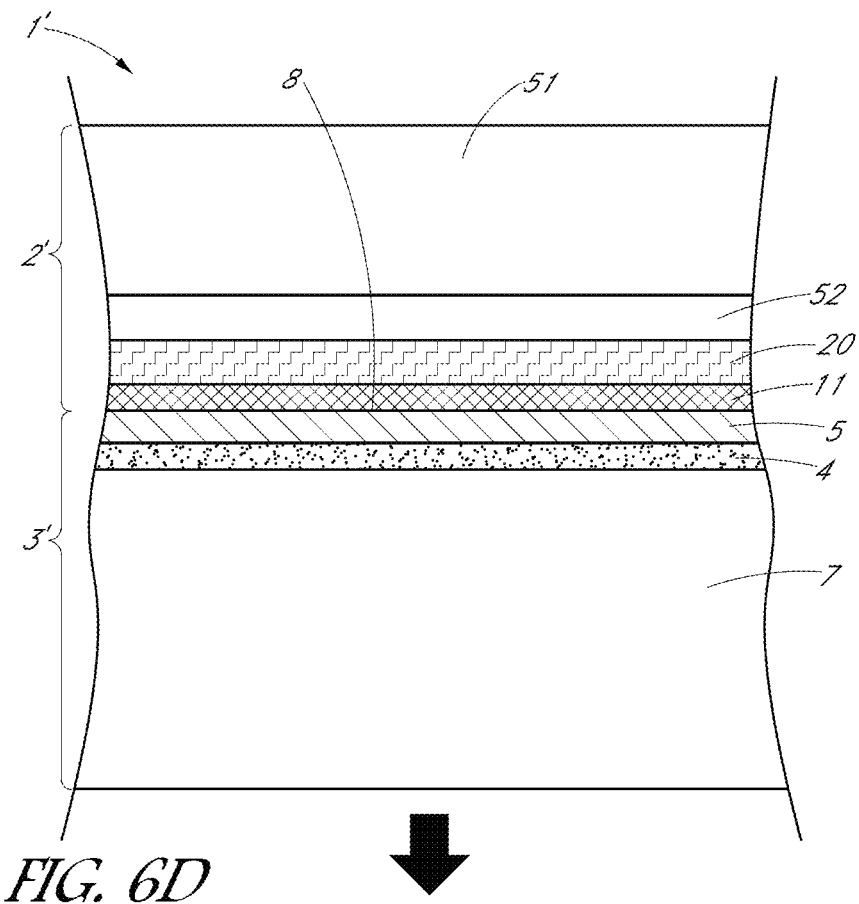

Turning to FIGS. 6A-6E, another method for wafer-to-wafer direct bonding of an obstructive element 3' in wafer form to an active semiconductor element 2' in wafer form is disclosed. In FIG. 6A a semiconductor element 2' in wafer form can include a sacrificial carrier wafer 51 comprising a silicon-on-insulator (SOI) wafer in which a buried oxide (BOX) layer 52 underlying an active silicon layer or region 20 is provided on an upper surface of the carrier wafer 51. In various embodiments, the carrier wafer 51 can comprise a semiconductor such as silicon. A bonding layer 11 (e.g., silicon oxide) can be provided over the active silicon layer 20. In various embodiments, the silicon carrier layer 51 and/or the BOX layer 52 can have a thickness in a range of 10 nm to 100 nm. On a separate obstructive element 3' in wafer form, as shown in FIGS. 6B and 6C, the obstructive material 4 can be provided in any suitable manner, for example, provided in blanket form or provided in a pattern. A dielectric bonding layer 5 (for example, silicon oxide) can also be provided on the obstructive material 4 and prepared for direct bonding as explained above.

Figure 6E:
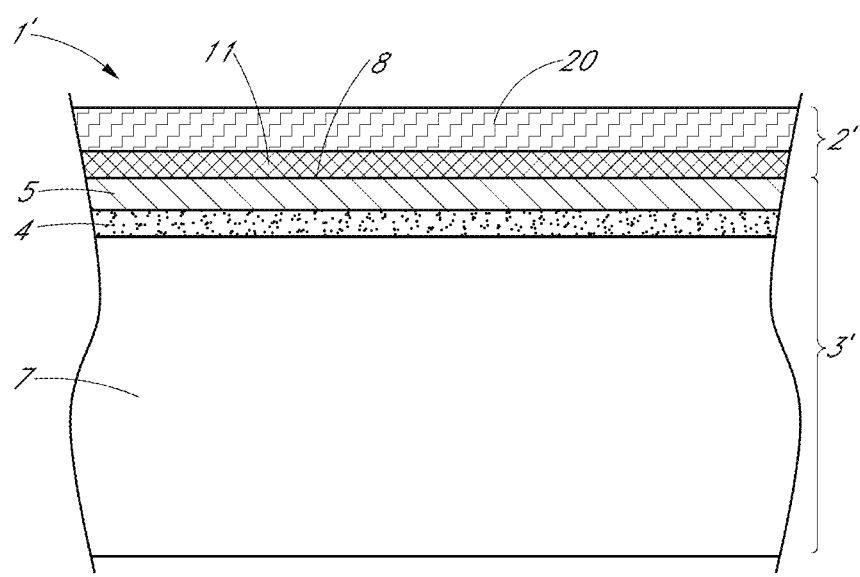

The semiconductor element 2' comprising the SOI wafer and the obstructive element 3' in wafer form can be directly bonded to one another without an adhesive as shown in FIG. 6D. After the direct bonding, the sacrificial silicon carrier 51 can be removed from the bonded structure 1' and the semiconductor element 2' to form the bonded structure 1' in wafer form as shown in FIG. 6E. For example, in various embodiments, the carrier 51 (such as a silicon material) can be removed by methods known in the art, such as implantation and cleaving, etching and/or backgrinding, etc. In some embodiments, as shown, the BOX layer 52 can also be removed. In other embodiments, the BOX layer 52 can remain on the active layer 20. The resultant substrate, including exposed active silicon layer 20 and buried obstructive material 4, can be prepared for functional wafer processing to fabricate devices such as integrated circuits, similar to processes for forming silicon-on-insulator substrates for subsequent processing. As explained above, bond pads on the active silicon layer 20 can be exposed so as to electrically connect to other devices.

Figure 7:
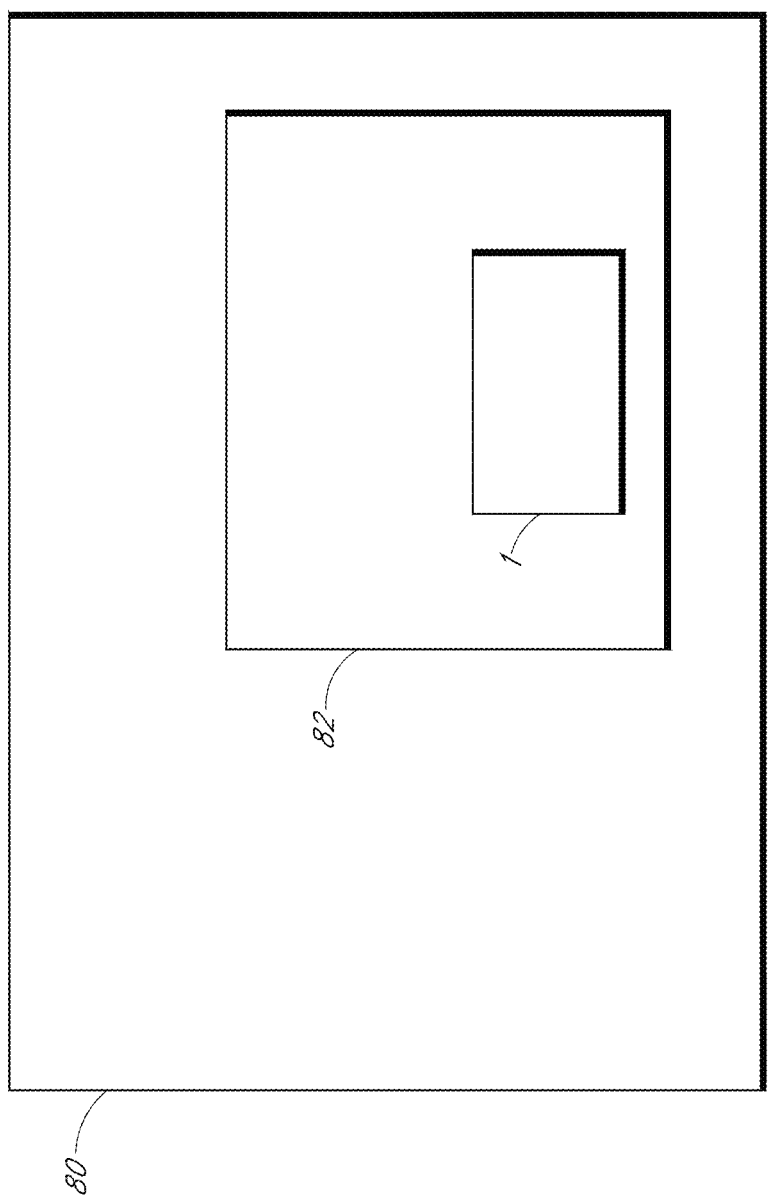
FIG. 7 is a schematic diagram of an electronic system incorporating one or more bonded structures, according to various embodiments.

FIG. 7 is a schematic diagram of an electronic system 80 incorporating one or more bonded structures 1, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic system 80 can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more bonded structures 1. The package 82 may be similar to or the same as the packages 30 described herein. The system 80 shown in FIG. 7 can comprise any of the bonded structures 1 and associated obstructive elements 3 as shown and described herein.

Accordingly, various embodiments disclosed herein enable wafer-to-wafer bonding of obstructive elements with obstructive material layers to an active semiconductor element (such as an active die). As a result of the wafer-to-wafer processing, various artifact structures may be present. The artifact structures may be indicative of a wafer-level bond in which the semiconductor element and the obstructive element formed part of respective wafers directly bonded prior to singulation.

In one embodiment, a bonded structure is disclosed. The bonded structure can include a semiconductor element comprising active circuitry. The bonded structure can include an obstructive element bonded to the semiconductor element along a bond interface, the obstructive element including an obstructive material disposed over the active circuitry, the obstructive material configured to obstruct external access to the active circuitry. The bonded element can include an artifact structure indicative of a wafer-level bond in which the semiconductor element and the obstructive element formed part of respective wafers directly bonded prior to singulation.

In some embodiments, the obstructive material can be positioned at a distance less than 10 microns from the bond interface. The obstructive material can be positioned at a distance less than 5 microns from the bond interface. The obstructive material can comprise a destructive material having a hardness in a range of 20 GPa to 150 GPa. The obstructive material can comprise a destructive material having a hardness of at least 80 GPa. The obstructive element can be directly bonded to the semiconductor element without an adhesive. The artifact structure can comprise markings on the obstructive material indicative of a patterning process performed prior to bonding. The artifact structure can comprise a first sidewall of the semiconductor element being flush with a second sidewall of the obstructive element. The bonded element can include a first bonding layer on the semiconductor element and a second bonding layer on the obstructive element, the first and second bonding layers directly bonded to one another without an adhesive. The first and second bonding layers can comprise silicon oxide. The artifact structure can comprise a trench formed through a back side of the obstructive element through the obstructive material to expose a bond pad on the semiconductor element. The trench can extend through the second bonding layer to the bond interface. A bond wire can be electrically connected to the bond pad in the trench. A conductive trace can extend from the bond pad in the trench to the back side of the obstructive element. A bond wire can be electrically connected to the trace at the back side of the obstructive element. A dielectric liner can be disposed along a vertical sidewall of the trench, the dielectric liner extending towards the back side of the obstructive element. The dielectric liner may not extend to the back side of the obstructive element. A thickness of the obstructive material at a first location near the bond pad can be greater than a thickness of the obstructive material at a second location that is farther from the bond pad than the first location. The artifact structure can comprise a lateral side surface of the obstructive element including saw markings indicative of a saw cut. The artifact structure can comprise a lateral side surface of the second bonding layer including saw markings indicative of the saw cut. The artifact structure can comprise the lateral side surface of the obstructive element also including an etch pattern indicative of an etching process. The artifact structure can comprise a lateral side surface of the obstructive element including an etch pattern indicative of an etching process. The artifact structure can comprise a lateral side surface of the second bonding layer including an etch pattern indicative of the etching process. The etch pattern can be indicative of an etch pathway extending towards a back side of the obstructive element that faces away from the bond interface, the lateral side surface of the obstructive element also comprising a second etch pattern indicative of a second etch pathway extending away from the back side of the obstructive element. The semiconductor element can comprise an active semiconductor region including the active circuitry and a bulk semiconductor region, the first bonding layer disposed on the bulk semiconductor region such that the bulk semiconductor region is between the active semiconductor region and the first bonding layer. The obstructive element can comprise a semiconductor substrate, the obstructive material disposed on the semiconductor substrate such that the obstructive material is between the second bonding layer and the semiconductor substrate. The semiconductor element can comprise an active semiconductor region including the active circuitry, the first bonding layer disposed on the active semiconductor region. The obstructive element can comprise a semiconductor substrate, the obstructive material disposed on the semiconductor substrate such that the obstructive material is between the second bonding layer and the semiconductor substrate.

In another embodiment, a method for forming a bonded structure is disclosed. The method can comprise directly bonding a semiconductor element having active circuitry to a wafer without an adhesive, the wafer comprising an obstructive material configured to obstruct external access to the active circuitry. The method can comprise after the directly bonding, singulating the wafer to form a plurality of singulated bonded structures.

In some embodiments, the semiconductor element comprises a second wafer that includes the active circuitry, the method comprising singulating the second wafer after the directly bonding. The method can comprise patterning the obstructive material before the directly bonding. The method can comprise partially sawing through the wafer before the directly bonding. The method can comprise partially etching through the wafer before the directly bonding. The method can comprise applying the obstructive material over a patterned additive material, applying a dielectric layer over the obstructive material, and removing portions of the obstructive material and the dielectric layer to form openings in the obstructive material. The method can comprise after the directly bonding, forming a trench through a back side of the wafer through the obstructive material to a bond pad on the semiconductor element. The method can comprise connecting a bond wire to the bond pad within the trench. The method can comprise connecting a bond wire to a trace at the back side of the wafer, the trace connected to the bond pad within the trench. Singulating the wafer can comprise etching the wafer to form the plurality of singulated bonded structures. Singulating the wafer can comprise sawing the wafer to form the plurality of singulated bonded structures. The method can comprise forming the semiconductor element before the directly bonding. The semiconductor element can comprise a bulk semiconductor region and an active semiconductor region over the bulk semiconductor region, wherein forming the semiconductor element can comprise bonding a handle element to the active semiconductor region. Bonding the handle element can comprise bonding the handle element to the active semiconductor region with an adhesive. Bonding the handle element can comprise directly bonding the handle element to the active semiconductor region without an adhesive. The method can comprise removing a portion of the bulk semiconductor region after bonding the handle element to form an exposed back surface of the bulk semiconductor region. The method can comprise providing a first bonding layer on the exposed back surface of the bulk semiconductor region. Directly bonding can comprise directly bonding the first bonding layer to a second bonding layer formed on the obstructive material without an adhesive. The method can comprise after the directly bonding, removing the handle element. The semiconductor element can comprise a bulk semiconductor region and an active semiconductor region over the bulk semiconductor region, wherein forming the semiconductor element can comprise providing a first bonding layer on the active semiconductor region. The active semiconductor region can comprise an active silicon layer over a buried oxide (BOX) layer. The method can comprise providing a second bonding layer on the obstructive material. Directly bonding can comprise directly bonding the first and second bonding layers without an adhesive. The method can comprise removing the bulk semiconductor region from the active semiconductor region. The first and second bonding layers can comprise silicon oxide.

Although disclosed in the context of certain embodiments and examples, it will be understood by those skilled in the art that the present invention extends beyond the specifically disclosed embodiments to other alternative embodiments and/or uses and obvious modifications and equivalents thereof. Further, unless otherwise noted, the components of an illustration may be the same as or generally similar to like-numbered components of one or more different illustrations. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the aspects that follow.

What is claimed is:
1. A bonded structure comprising:
   a semiconductor element comprising active circuitry;
   an obstructive element bonded to the semiconductor element along a bond interface, the obstructive element including an obstructive material disposed over the active circuitry, the obstructive material configured to obstruct external access to the active circuitry; and
   an artifact structure indicative of a wafer-level bond in which the semiconductor element and the obstructive element formed part of respective wafers directly bonded prior to singulation.
2. The bonded structure of claim 1, wherein the obstructive material is positioned at a distance less than 10 microns from the bond interface.

3. The bonded structure of claim 1, wherein the obstructive material comprises a destructive material having a hardness in a range of 13 GPa to 150 GPa.

4. The bonded structure of claim 1, wherein the artifact structure includes markings on the obstructive material indicative of a patterning process performed prior to bonding.

5. The bonded structure of claim 1, wherein the artifact structure comprises a first sidewall of the semiconductor element being flush with a second sidewall of the obstructive element.

6. The bonded structure of claim 1, further comprising a first bonding layer on the semiconductor element and a second bonding layer on the obstructive element, the first and second bonding layers directly bonded to one another without an adhesive.

7. The bonded structure of claim 6, wherein the artifact structure comprises a trench formed through a back side of the obstructive element through the obstructive material to expose a bond pad on the semiconductor element.

8. The bonded structure of claim 7, wherein the trench extends through the second bonding layer to the bond interface.

9. The bonded structure of claim 7, further comprising a bond wire electrically connected to the bond pad in the trench.

10. The bonded structure of claim 7, further comprising a conductive trace extending from the bond pad in the trench to the back side of the obstructive element.

11. The bonded structure of claim 7, further comprising a dielectric liner disposed along a vertical sidewall of the trench, the dielectric liner extending towards the back side of the obstructive element.

12. The bonded structure of claim 6, wherein the artifact structure comprises a lateral side surface of the obstructive element including saw markings indicative of a saw cut.

13. The bonded structure of claim 12, wherein the artifact structure comprises the lateral side surface of the obstructive element also including an etch pattern indicative of an etching process.

14. The bonded structure of claim 6, wherein the artifact structure comprises a lateral side surface of the obstructive element including an etch pattern indicative of an etching process.

15. The bonded structure of claim 14, wherein the etch pattern is indicative of an etch pathway extending towards a back side of the obstructive element that faces away from the bond interface, the lateral side surface of the obstructive element also comprising a second etch pattern indicative of a second etch pathway extending away from the back side of the obstructive element.

16. The bonded structure of claim 6, wherein the semiconductor element comprises an active semiconductor region including the active circuitry and a bulk semiconductor region, the first bonding layer disposed on the bulk semiconductor region such that the bulk semiconductor region is between the active semiconductor region and the first bonding layer.

17. The bonded structure of claim 6, wherein the semiconductor element comprises an active semiconductor region including the active circuitry, the first bonding layer disposed on the active semiconductor region.

18. A method for forming a bonded structure, the method comprising:
    directly bonding a semiconductor element having active circuitry to a wafer without an adhesive, the wafer comprising an obstructive material configured to obstruct external access to the active circuitry; and
    after the directly bonding, singulating the wafer to form a plurality of singulated bonded structures.

19. The method of claim 18, wherein the semiconductor element comprises a second wafer that includes the active circuitry, the method comprising singulating the second wafer after the directly bonding.

20. The method of claim 18, further comprising patterning the obstructive material before the directly bonding.

21. The method of claim 20, further comprising partially sawing or partially etching through the wafer before the directly bonding.

22. The method of claim 20, further comprising applying the obstructive material over a patterned additive material, applying a dielectric layer over the obstructive material, and removing portions of the obstructive material and the dielectric layer to form openings in the obstructive material.

23. The method of claim 18, further comprising, after the directly bonding, forming a trench through a back side of the wafer through the obstructive material to a bond pad on the semiconductor element.

24. The method of claim 18, further comprising forming the semiconductor element before the directly bonding, the semiconductor element comprising a bulk semiconductor region and an active semiconductor region over the bulk semiconductor region, wherein forming the semiconductor element comprises bonding a handle element to the active semiconductor region.

25. The method of claim 24, further comprising removing a portion of the bulk semiconductor region after bonding the handle element to form an exposed back surface of the bulk semiconductor region, providing a first bonding layer on the exposed back surface of the bulk semiconductor region, and removing the handle element after the directly bonding.

26. The method of claim 18, further comprising forming the semiconductor element before the directly bonding, the semiconductor element comprising a bulk semiconductor region and an active semiconductor region over the bulk semiconductor region, wherein forming the semiconductor element comprises providing a first bonding layer on the active semiconductor region.

27. The method of claim 26, wherein the active semiconductor region comprises an active silicon layer over a buried oxide (BOX) layer.

28. The method of claim 26, further comprising providing a second bonding layer on the obstructive material, wherein the directly bonding comprises directly bonding the first and second bonding layers without an adhesive.

* * * * *